United States Patent
Fang et al.

(10) Patent No.: US 11,893,333 B2
(45) Date of Patent: Feb. 6, 2024

(54) HYBRID SHEET LAYOUT, METHOD, SYSTEM, AND STRUCTURE

(71) Applicant: TAIWAN SEMICONDUCTOR MANUFACTURING COMPANY, LTD., Hsinchu (TW)

(72) Inventors: Shang-Wei Fang, Hsinchu (TW); Kam-Tou Sio, Hsinchu (TW); Wei-Cheng Lin, Hsinchu (TW); Jiann-Tyng Tzeng, Hsinchu (TW); Lee-Chung Lu, Hsinchu (TW); Yi-Kan Cheng, Hsinchu (TW); Chung-Hsing Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 219 days.

(21) Appl. No.: 17/147,923

(22) Filed: Jan. 13, 2021

(65) Prior Publication Data
US 2021/0357565 A1    Nov. 18, 2021

Related U.S. Application Data

(60) Provisional application No. 63/023,466, filed on May 12, 2020.

(51) Int. Cl.
*G06F 30/392*    (2020.01)
*G06F 30/398*    (2020.01)

(52) U.S. Cl.
CPC .......... *G06F 30/392* (2020.01); *G06F 30/398* (2020.01)

(58) Field of Classification Search
CPC .... G06F 30/392; G06F 30/398; G06F 30/394; G06F 2111/20; G06F 30/30;
(Continued)

(56) References Cited

U.S. PATENT DOCUMENTS

| 7,260,442 B2 | 8/2007 | Hwang et al. |
| 8,261,229 B2 | 9/2012 | Hart |

(Continued)

FOREIGN PATENT DOCUMENTS

| CN | 111048505 | 4/2020 |
| CN | 111128998 | 5/2020 |

(Continued)

OTHER PUBLICATIONS

Office Action dated May 24, 2022 for corresponding case No. TW 11120511620. (pp. 1-4).

(Continued)

*Primary Examiner* — Binh C Tat
(74) *Attorney, Agent, or Firm* — Hauptman Ham, LLP

(57) ABSTRACT

A method of generating an IC layout diagram includes abutting a first row of cells with a second row of cells along a border, the first row including first and second active sheets, the second row including third and fourth active sheets, the active sheets extending along a row direction and having width values. The active sheets are overlapped with first through fourth back-side via regions, the first active sheet width value is greater than the third active sheet width value, a first back-side via region width values is greater than a third back-side via region width value, and a value of a distance from the first active sheet to the border is less than a minimum spacing rule for metal-like defined regions. At least one of abutting the first row with the second row or overlapping the active sheets with the back-side via regions is performed by a processor.

20 Claims, 16 Drawing Sheets

(58) Field of Classification Search
CPC .. G06F 2119/18; G06F 30/39; G06F 2111/06; G06F 2115/08; G06F 2119/10; G06F 30/3312; G06F 30/367; G06F 2111/14; G06F 30/34; G06F 2117/12; G06F 2119/02; G06F 2119/22; G06F 30/00; G06F 30/327; G06F 30/3953; G06F 30/3947; G06F 12/0607; G06F 15/17375; G06F 2111/04; G06F 30/31; G06F 2119/06; G06F 2119/12; G06F 30/337; G06F 2117/10; G06F 2203/04104; G06F 3/04166; G06F 3/0446; H01L 27/0207; H01L 2225/06541; H01L 23/528; H01L 2924/15311; H01L 27/0688; H01L 2224/73265; H01L 2924/13091; H01L 2924/13062; H01L 2924/1305; H01L 29/66795; H01L 2224/32225; H01L 2027/11875; H01L 21/027; H01L 29/66439; H01L 21/845; H01L 29/775; H01L 21/2007; H01L 21/82385; H01L 2924/1433; G03F 1/36; G03F 1/84; G03F 1/70; G03F 7/70433
USPC .................................................. 716/118–125
See application file for complete search history.

(56) References Cited

U.S. PATENT DOCUMENTS

| | | |
|---|---|---|
| 9,256,709 B2 | 2/2016 | Yu et al. |
| 11,139,402 B2 | 10/2021 | Moroz et al. |
| 2002/0020862 A1 | 2/2002 | Livengood et al. |
| 2011/0049575 A1 | 3/2011 | Tanaka |
| 2013/0027083 A1 | 1/2013 | Ando et al. |
| 2014/0040838 A1 | 2/2014 | Liu et al. |
| 2015/0052494 A1 | 2/2015 | Tarabbia et al. |
| 2015/0278429 A1 | 10/2015 | Chang |
| 2016/0055283 A1* | 2/2016 | Oh .................. G06F 30/392 716/112 |
| 2017/0179244 A1 | 6/2017 | Radens et al. |
| 2017/0358565 A1 | 12/2017 | Hensel et al. |
| 2020/0019672 A1* | 1/2020 | Peng .................. G03F 1/70 |
| 2020/0104446 A1 | 4/2020 | Li et al. |
| 2020/0104462 A1 | 4/2020 | Chen et al. |
| 2020/0134119 A1 | 4/2020 | Sio et al. |
| 2020/0134122 A1 | 4/2020 | Huang et al. |
| 2020/0134125 A1* | 4/2020 | Huang ............ G06F 30/398 |

FOREIGN PATENT DOCUMENTS

| | | |
|---|---|---|
| CN | 111129000 | 5/2020 |
| KR | 20120112797 | 10/2012 |
| KR | 20190098078 | 8/2019 |
| KR | 20200134150 | 12/2020 |
| KR | 20200137046 | 12/2020 |
| TW | 201901906 | 1/2019 |
| TW | 201909382 | 3/2019 |
| TW | I667751 | 8/2019 |
| TW | 202002032 | 1/2020 |

OTHER PUBLICATIONS

Office Action dated Mar. 25, 2022 for corresponding case No. DE 10 2021 100 870.0. (pp. 1-14).

Notice of Allowance dated Jul. 28, 2022 for corresponding case No. KR 10-2021-0031452. (pp. 1-7) English abstract attached on p. 1.

Office Action dated Jun. 30, 2023 for corresponding case No. CN 202110518760.1. (pp. 1-12).

* cited by examiner

HYBRID SHEET LAYOUT, METHOD, SYSTEM, AND STRUCTURE

PRIORITY CLAIM

The present application claims the priority of U.S. Provisional Application No. 63/023,466, filed May 12, 2020, which is incorporated herein by reference in its entirety.

BACKGROUND

The ongoing trend in miniaturizing integrated circuits (ICs) has resulted in progressively smaller devices which consume less power, yet provide more functionality at higher speeds than earlier technologies. Such miniaturization has been achieved through design and manufacturing innovations tied to increasingly strict specifications. Various electronic design automation (EDA) tools are used to generate, revise, and verify designs for semiconductor devices while ensuring that IC structure design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
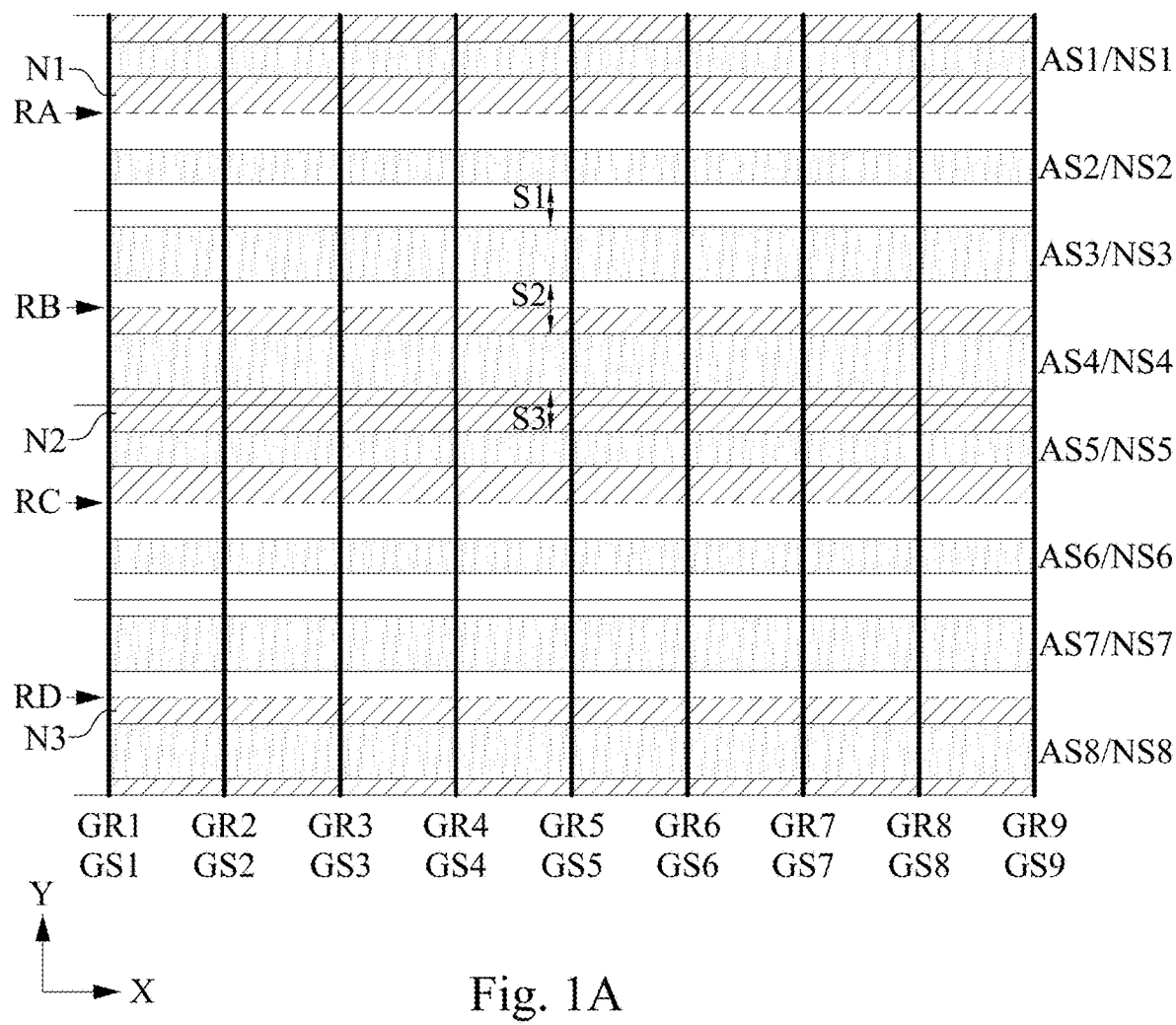
FIG. 1A is a diagram of an IC layout diagram and an IC structure, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, an IC layout, and a structure manufactured based on the IC layout, includes first through fourth active sheets extending along a first direction and overlapping respective first through fourth back-side vias configured to provide electrical connections to a back-side power distribution structure. Each of the active sheets and back-side vias has a width perpendicular to the first direction, the width of at least one of the first or second active sheets is greater than that of at least one of the third or fourth active sheets, and the width of the corresponding first or second back-side via is greater than that of the corresponding third or fourth back-side via.

By including active sheets and corresponding back-side vias, electrical connections to front-side power distribution structures shared by adjacent rows of cells are avoided. Cell area otherwise dedicated to front-side electrical connections is thereby available such that active sheets are capable of being wider than those in approaches including electrical connections to front side power distribution structures. Accordingly, layout flexibility of circuits having varying timing criticalities is improved compared to approaches in which active sheets have widths that accommodate front-side electrical connections.

FIGS. 1A-5 are diagrams of an IC layout diagram 100A and a corresponding IC structure 100B manufactured based on IC layout diagram 100A, in accordance with some embodiments. In addition to IC layout diagram 100A and IC structure 100B, each of FIGS. 1A-5 depicts a subset of X, Y, and Z directions.

Figure 1B:
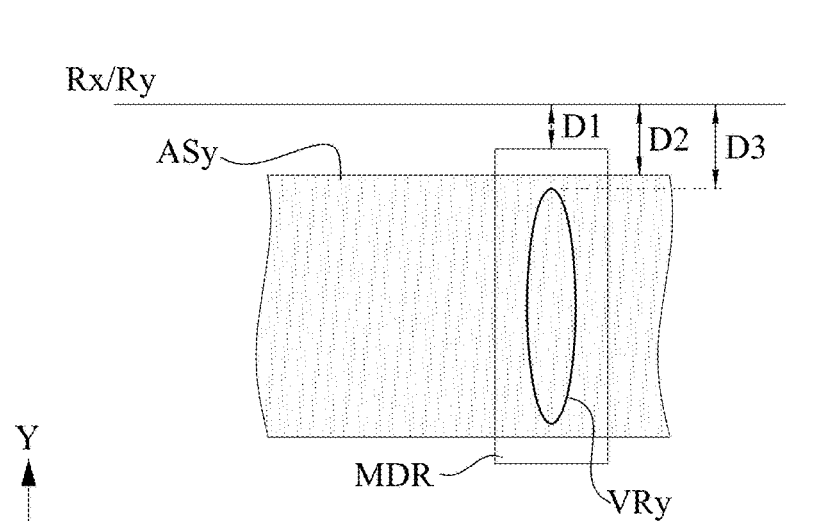
FIG. 1B is a diagram of an IC layout diagram, in accordance with some embodiments.
Figure 2A:
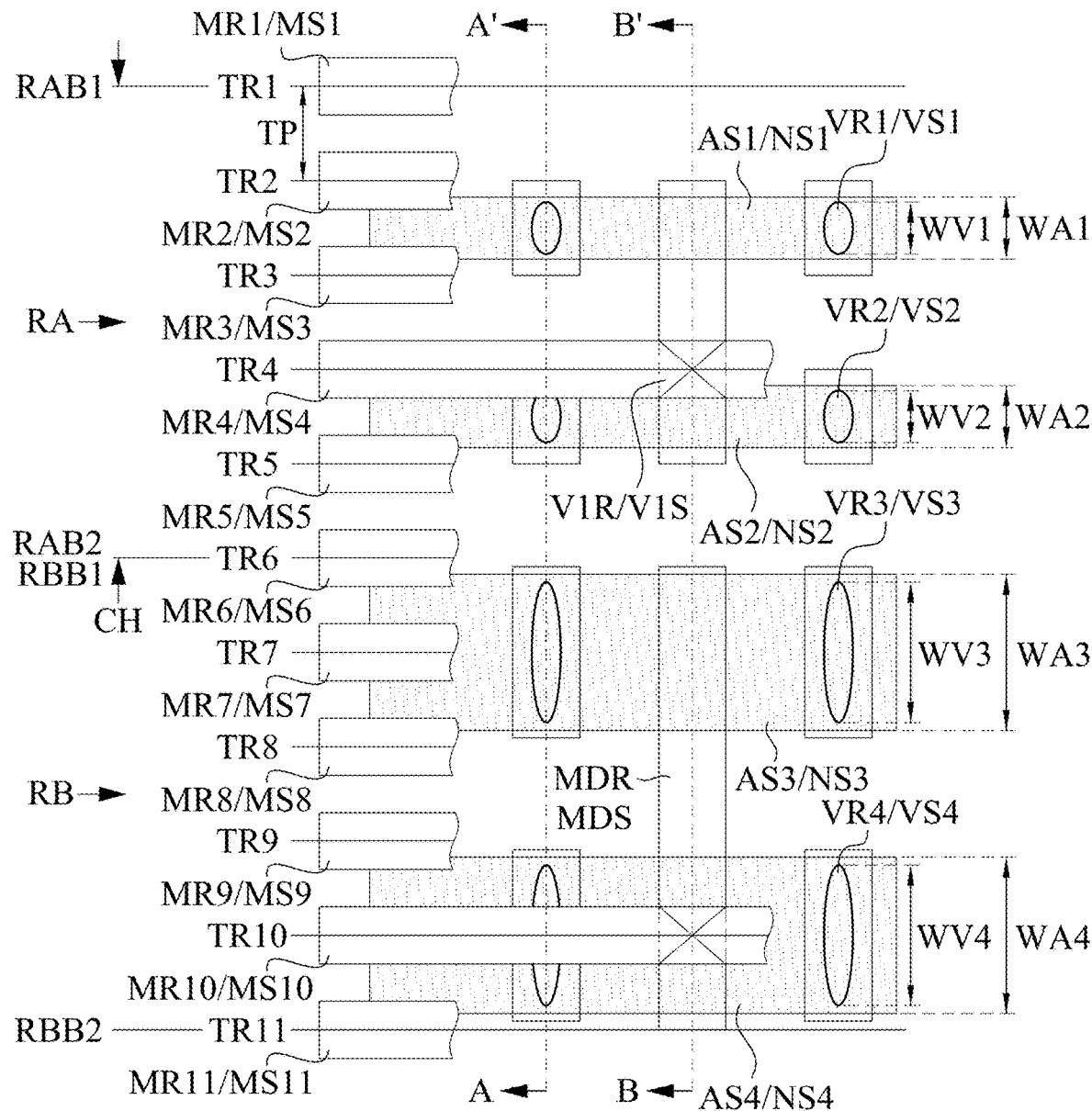
FIGS. 2A-2C are diagrams of an IC layout diagram and an IC structure, in accordance with some embodiments.
Figure 2B:
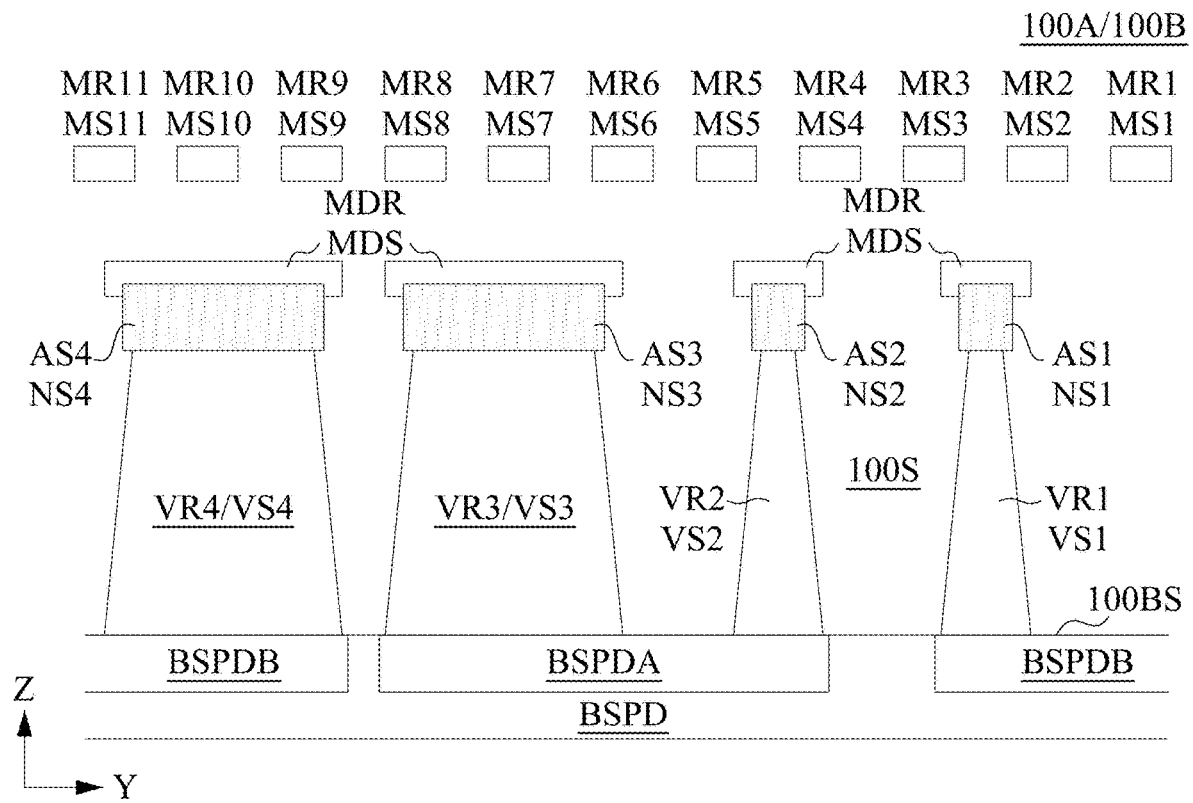
Figure 2C:
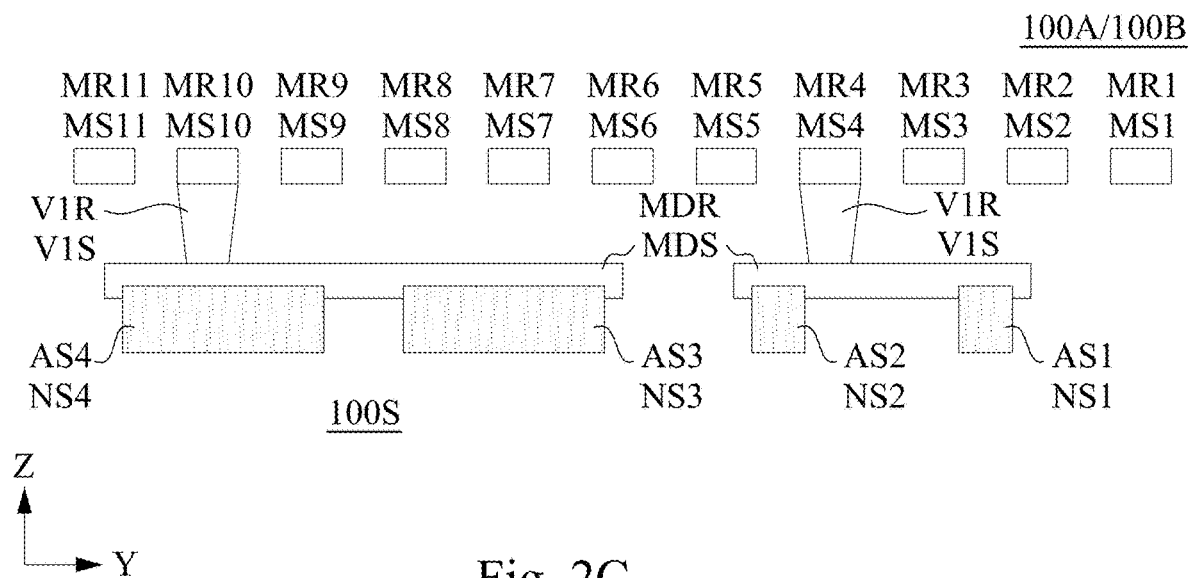
Figure 3A:
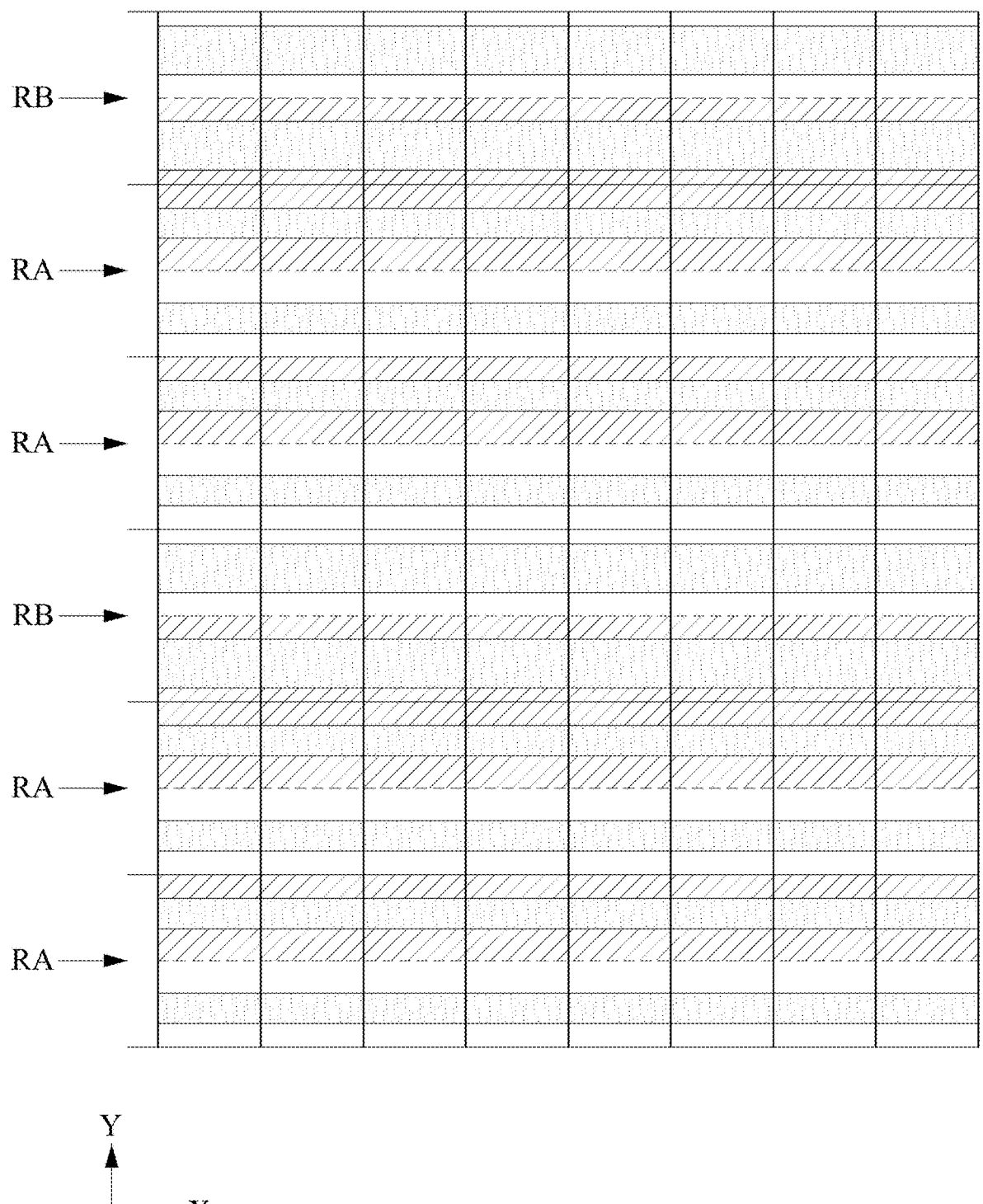
FIGS. 3A and 3B are diagrams of an IC layout diagram and an IC structure, in accordance with some embodiments.
Figure 3B:
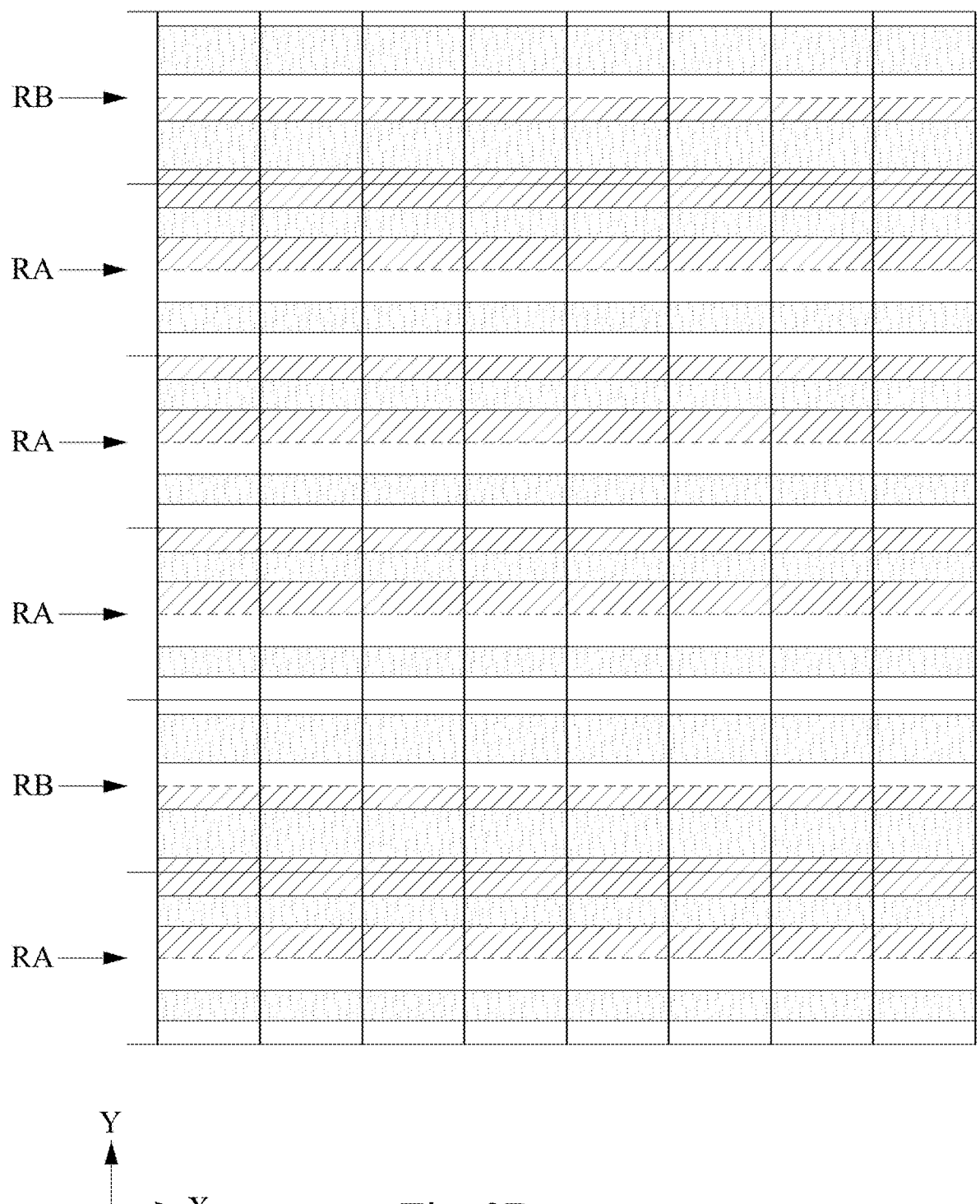
Figure 4A:
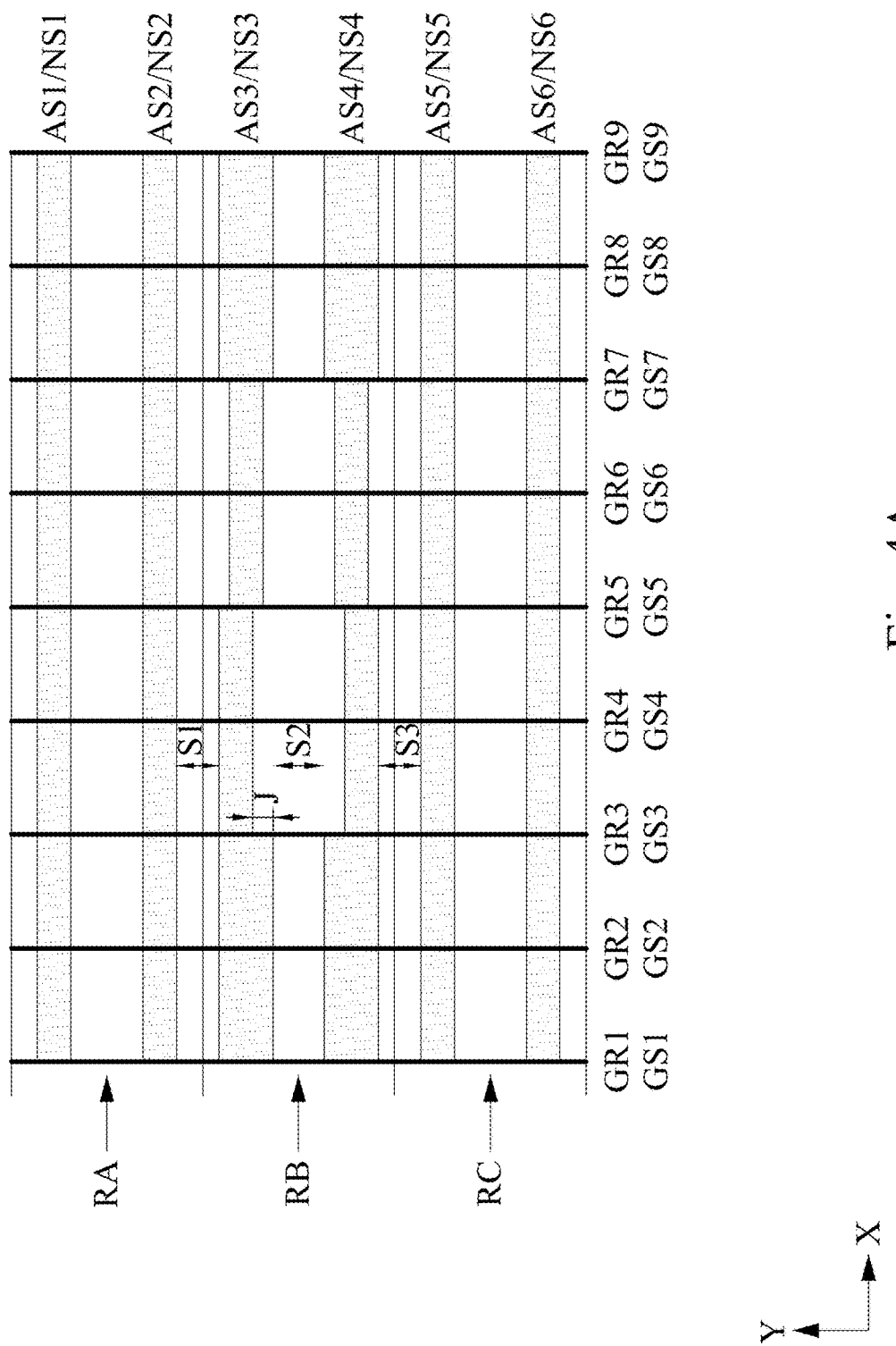
FIGS. 4A-4F are diagrams of an IC layout diagram and an IC structure, in accordance with some embodiments.

FIG. 1A depicts a plan view (X-Y plane) of an embodiment corresponding to four rows RA-RD of IC layout cells (described below and not identified individually) extending in the X direction, also referred to as a row direction in some embodiments; FIG. 1B depicts a plan view of a representative portion of IC layout diagram 100A; FIGS. 2A-2C depict plan and cross-sectional views (Y-Z plane) of portions of rows RA and RB, a substrate 100S, and a back-side power distribution structure BSPD; FIGS. 3A and 3B depict plan views of arrangements of rows RA and RB, and FIGS. 4A-5 depict plan views of rows RA-RC in accordance with various embodiments. In the various embodiments, a given one of rows RA-RD abuts one or more additional ones of rows RA-RD.

IC layout diagram 100A is a non-limiting example of an IC layout diagram generated by executing some or all of a method 600 discussed below with respect to FIG. 6, and IC structure 100B is a non-limiting example of an IC structure manufactured based on IC layout diagram 100A by executing some or all of a method 700 discussed below with respect to FIG. 7.

The diagrams of FIGS. 1A-5 are simplified for the purpose of illustration. FIGS. 1A-5 depict views of IC layout diagram 100A and IC structure 100B with various features included and excluded to facilitate the discussion below. In various embodiments, IC layout diagram 100A and/or IC structure 100B includes one or more elements corresponding to metal interconnects, contacts, vias, gate structures or other transistor elements, wells, isolation structures, or the like, in addition to the elements depicted in FIGS. 1A-5.

FIGS. 1A-5 depict IC layout diagram 100A including some or all of active sheets AS1-AS8 and IC structure 100B including the corresponding some or all of nano-sheets NS1-NS8 extending in the X direction, and FIGS. 1A and 3A-5 depict layout diagram 100A including gate regions GR1-GR9 and IC structure 100B including the corresponding gate structures GS1-GS9 extending in the Y direction. In various embodiments, IC layout diagram 100A and/or IC structure 100B has an orientation other than the orientation depicted in FIGS. 1A-5, e.g., rotated or inverted with respect to one or more of the X, Y, or Z directions.

An active sheet, e.g., an active sheet AS1-AS8, is a region in an IC layout diagram included in a manufacturing process as part of defining a nano-sheet structure, e.g., one of nano-sheets NS1-N58, on a semiconductor substrate, e.g., substrate 100S. A nano-sheet structure is a continuous volume of one or more layers of one or more semiconductor materials having either n-type or p-type doping. In various embodiments, a nano-sheet structure includes one or more of silicon (Si), silicon-germanium (SiGe), silicon-carbide (SiC), boron (B), phosphorous (P), arsenic (As), gallium (Ga), or another suitable material. In various embodiments, individual nano-sheet layers include a single monolayer or multiple monolayers of a given semiconductor material. In some embodiments, a nano-sheet structure has a thickness ranging from one nanometer (nm) to 100 nm.

In various embodiments, a nano-sheet structure includes one or more portions included in one or more of a planar transistor, a fin field-effect transistor (FinFET), or a gate all around (GAA) transistor and/or includes one or more source/drain structures (not shown). In some embodiments, a nano-sheet structure is electrically isolated from other elements in the semiconductor substrate by one or more isolation structures (not shown), e.g., one or more shallow trench isolation (STI) structures.

A gate region, e.g., one of gate regions GR1-GR9, is a region in an IC layout diagram included in a manufacturing process as part of defining a gate structure, e.g., one of gate structures GS1-GS9, overlying the semiconductor substrate. A gate structure is a volume including one or more conductive materials substantially surrounded by one or more dielectric layers (not shown) including one or more dielectric materials configured to electrically isolate the one or more conductive materials from overlying, underlying, and/or adjacent structures, e.g., nano-sheets NS1-NS9.

Conductive materials include one or more of polysilicon, copper (Cu), aluminum (Al), tungsten (W), cobalt (Co), ruthenium (Ru), or one or more other metals, and/or one or more other suitable materials. Dielectric materials include one or more of silicon dioxide ($SiO_2$), silicon nitride ($Si_3N_4$), and/or a high-k dielectric material, e.g., a dielectric material having a k value higher than 3.8 or 7.0 such as aluminum oxide ($Al_2O_3$), hafnium oxide ($HfO_2$), tantalum pentoxide ($Ta_2O_5$), or titanium oxide ($TiO_2$), or another suitable material.

As depicted in FIG. 1A, row RA includes active sheets AS1 and AS2 and corresponding nano-sheets NS1 and NS2, row RB includes active sheets AS3 and AS4 and corresponding nano-sheets NS3 and NS4, row RC includes active sheets AS5 and AS6 and corresponding nano-sheets NS5 and NS6, and row RD includes active sheets AS7 and AS8 and corresponding nano-sheets NS7 and NS8. In the embodiment depicted in FIGS. 1A, 3A, and 3B, active sheets AS1, AS4, AS5, and AS8 correspond to nano-sheets NS1, NS4, NS5, and NS8 having p-type doping and being located in respective n-wells N1, N2, and N3, and active sheets AS2, AS3, AS6, and AS7 correspond to nano-sheets NS2, NS3, NS6, and NS7 having n-type doping. In various embodiments, active sheets AS1-AS8 correspond to nano-sheets NS1-NS8 having other combinations of doping types and/or n-well or p-well locations, e.g., active sheets AS1, AS4, AS5, and AS8 corresponding to nano-sheets NS1, NS4, NS5, and NS8 having n-type doping and active sheets AS2, AS3, AS6, and AS7 corresponding to nano-sheets NS2, NS3, NS6, and NS7 having p-type doping.

A given pair of adjacent active sheets/nano-sheets, e.g., active sheets/nano-sheets AS2/NS2 and AS3/NS3, having a first same doping type, e.g., n-type, are separated by a distance S1; a given pair of adjacent active sheets/nano-sheets, e.g., active sheets/nano-sheets AS3/NS3 and AS4/NS4, having opposite doping types are separated by a distance S2; and a given pair of adjacent active sheets/nano-sheets, e.g., active sheets/nano-sheets AS4/NS4 and AS5/NS5, having a second same doping type, e.g., p-type, are separated by a distance S3. Each of distances S1, S2, and S3 has a value equal to or greater than a corresponding minimum spacing between pairs of adjacent active sheets/nano-sheets, e.g., a minimum spacing rule of the process used to manufacture IC structure 100B based on IC layout diagram 100A.

Portions of active sheets/nano-sheets AS1/NS1-AS8/NS8 are configured to include and/or abut source/drain (S/D) regions/structures, e.g., metal-like defined (MD) regions/segments MDR/MDS discussed below. In some cases, a location at which a gate region GR1-GR9 intersects an active sheet AS1-AS8 in IC layout diagram 100A corresponds to a transistor in IC structure 100B that includes some or all of portions of the corresponding gate structure GS1-GS9 overlying the corresponding nano-sheet NS1-NS9, the corresponding nano-sheet NS1-NS9 below, partially surrounded by, and/or adjacent to the corresponding gate structure GS1-GS9, and S/D structures adjacent to the corresponding gate structure GS1-GS9. In various embodiments, the transistor is a p-type metal oxide semiconductor (PMOS) transistor or an n-type metal oxide semiconductor (NMOS) transistor, depending on the doping type of the nano-sheet NS1-NS8. In other cases, a gate region GR1-GR9 intersects an active sheet AS1-AS8 at a location that does not correspond to a transistor, and the corresponding gate structure GS1-GS9, or portion thereof, is referred to as a dummy gate structure in some embodiments.

In some embodiments, a cell is a predefined portion of IC layout 100A including one or more transistors and electrical connections configured to perform one or more circuit functions, and thereby includes portions of one or more of gate regions GR1-GR9 and active sheets AS1-AS8. In various embodiments, individual cells within a given one or more of rows RA-RD have borders corresponding to non-adjacent ones of gate regions/gate structures GR1/GS1-GR9/GS9 such that a given cell includes the portions of at least one of gate regions/gate structures GR1/GS1-GR9/GS9 and adjacent S/D regions/structures configured as one or more corresponding transistors.

In some embodiments, e.g., the embodiments depicted in FIGS. 4A-5 discussed below, a given cell has borders corresponding to two of gate regions/gate structures GR1/GS1-GR9/GS9 spaced apart by a single gate region/structure. In various embodiments, a given cell has borders corresponding to two of gate regions/gate structures GR1/GS1-GR9/GS9 spaced apart by a number of gate regions/structures greater than one, e.g., ranging from two to five.

In the embodiment depicted in FIG. 1A, each cell includes a pair of active sheets/nano-sheets AS1/NS1-AS9/NS9 having each of n-type doping and p-type doping. In various embodiments, a cell includes a single one or more than two of active sheets/nano-sheets AS1/NS1-AS8/NS8. In various embodiments, a cell includes portions of gate regions/gate structures GR1/GS1-GR9/GS9 and/or active sheets/nano-sheets AS1/NS1-AS8/NS8 configured as one or more physical devices other than a transistor, e.g., a diode, resistive device, or capacitive device.

A cell is thereby configured as one or more a standard cell, a custom cell, an engineering change order (ECO) cell, a logic gate cell, a memory cell, a custom cell, a physical device cell, or another type of cell or combination of cells capable of being defined in an IC layout diagram, e.g., IC layout diagram 100A. In various embodiments, a logic gate cell includes one or more of an AND, OR, NAND, NOR, XOR, INV, AND-OR-Invert (AOI), OR-AND-Invert (OAI), MUX, flip-flop, BUFF, latch, delay, or clock device. In various embodiments, a memory cell includes one or more of a static random access memory (SRAM), a dynamic RAM (DRAM), a resistive RAM (RRAM), a magnetoresistive RAM (MRAM), or read only memory (ROM) cell, or another device capable of having multiple states representative of logical values.

FIG. 1B depicts a representative portion of IC layout diagram 100A including a border between a given pair of rows RA-RD depicted as border Rx/Ry, an active sheet ASy corresponding to one of active sheets AS1-AS8, a metal-like defined (MD) region MDR, and a back-side via region VRy. Border Rx/Ry is separated from MD region MDR by a distance D1, active sheet ASy by a distance D2, and back-side via region VRy by a distance D3. The orientation of border Rx/Ry relative to the other features depicted in FIG. 1B is an example provided for the purpose of illustration. In some embodiments, border Rx/Ry has an orientation other than that depicted in FIG. 1B, e.g., below the other features.

An MD region, e.g., an MD region MDR, is a conductive region in an IC layout diagram included in a manufacturing process as part of defining an MD segment, e.g., an MD segment MDS discussed below, also referred to as a conductive segment or MD conductive line or trace, in and/or on a semiconductor substrate, e.g., substrate 100S discussed below. In some embodiments, an MD segment includes a portion of at least one metal layer, e.g., a contact layer, overlying and contacting the substrate and having a thickness sufficiently small to enable formation of an insulation layer between the MD segment and an overlying metal layer, e.g., a first metal layer. In various embodiments, an MD segment includes one or more of copper (Cu), silver (Ag), tungsten (W), titanium (Ti), nickel (Ni), tin (Sn), aluminum (Al) or another metal or material suitable for providing a low resistance electrical connection between IC structure elements. In various embodiments, an MD segment includes an epitaxial layer having a doping level, e.g., based on an implantation process, sufficient to cause the segment to have the low resistance level. In various embodiments, a doped MD segment includes one or more of Si, SiGe, SiC, B, P, As, Ga, a metal as discussed above, or another material suitable for providing the low resistance level. In various embodiments, an MD region at least partly defines an MD segment corresponding to a portion or all of one or more S/D structures included in one or more transistors.

A via region is a region in an IC layout diagram included in a manufacturing process as part of defining a via structure configured to provide a low resistance electrical connection between conductive segments in two or more levels and/or layers of the manufacturing process. A back-side via region, e.g., back-side via region VRy or a back-side via region VR1-VR4 discussed below, is a via region in an IC layout diagram included in a manufacturing process as part of defining a via structure, e.g., a via structure VS1-VS4 discussed below, extending through a semiconductor substrate, e.g., substrate 100S, to a back-side surface of the substrate, e.g., a back-side surface 100BS depicted in FIG. 2B, and is thereby configured to electrically connect a feature in and/or on the substrate to one or more structures located at the back-side surface of the substrate, e.g., back-side power distribution structure BSPD discussed below. In various embodiments, a via structure corresponding to a back-side via region, e.g., a via structure VS1-VS4, is referred to as a back-side via structure or a through-silicon via (TSV) structure.

Because IC layout diagram 100A includes back-side via regions, e.g., back-side via region VRy, configured to provide electrical connections between active sheets, e.g. active sheet ASy, and a back-side power distribution structure, the area adjacent to border Rx/Ry is not used for electrical connections to a front-side power distribution structure along border Rx/Ry. Distance D1 is thereby capable of having values less than a minimum spacing rule for adjacent MD regions in the process used to manufacture IC structure 100B based on IC layout diagram 100A. In various embodiments, distance D1 has a value ranging from zero to the minimum spacing rule for adjacent MD regions.

In some embodiments, distance D2 has a value less than the minimum spacing rule for adjacent MD regions. In various embodiments, distance D2 has a value greater than, equal to, or less than the value of distance D1.

In some embodiments, distance D3 has a value less than the minimum spacing rule for adjacent MD regions. In various embodiments, distance D3 has a value greater than, equal to, or less than the value of distance D1. In various embodiments, distance D3 has a value greater than, equal to, or less than the value of distance D2.

Row Rx (not shown in FIG. 1B) adjacent to row Ry includes an active sheet ASx separated from border Rx/Ry by a second instance of distance D2 such that active sheets ASx and ASy are separated by a sum of distance D2 and the second instance of distance D2 equal to distance S1 or S3 discussed above; a value of the sum of distance D2 and the second instance of distance D2 is thereby greater than or equal to the minimum spacing rule for adjacent active sheets.

As illustrated in FIG. 1B, IC layout diagram 100A corresponds to embodiments in which nano-sheets electrically connected to a back-side power distribution structure through back-side via structures are capable of having configurations based on features positioned adjacent to a cell border, e.g., based on one or more of distances D1-D3 having a value less than the minimum spacing rule for adjacent MD regions. Non-limiting examples of such embodiments are discussed below with respect to FIGS. 2A-5.

FIG. 2A depicts a portion of rows RA and RB including active sheets AS1-AS4 and nano-sheets NS1-NS4, FIG. 2B depicts a cross-section of the portion depicted in FIG. 2A along a line A-A', and FIG. 2C depicts a cross-section of the portion depicted in FIG. 2A along a line B-B'. For the purpose of clarity, FIG. 2A does not depict instances of gate regions/structures GR1/GS1-GR9/GS9, e.g., positioned between lines A-A' and B-B'.

In addition to active sheets AS1-AS4 and nano-sheets NS1-NS4, FIGS. 2A-2C depict metal regions MR1-MR11 and corresponding metal segments MS1-MS11 positioned along respective metal tracks TR1-TR11 and extending in the X direction, two instances of first via regions V1R and corresponding first via structures V1S (one labeled for illustration), ten instances of MD regions MDR and corresponding MD segments MDS (one labeled for illustration), back-side via regions VR1-VR4 and corresponding back-side via structures VS1-VS4 (a subset labeled for illustration), and back-side power distribution structure BSPD including portions BSPDA and BSPDB.

A metal region, e.g., one of metal regions MR1-MR11, is a conductive region in an IC layout diagram included in a manufacturing process as part of defining a segment, e.g., one of metal segments MS1-MS11, also referred to as a conductive segment or conductive line, of a metal layer of the manufacturing process. A metal segment, e.g., a first metal segment, is a portion of a corresponding metal layer, e.g., a first metal layer, that includes one or more of copper (Cu), silver (Ag), tungsten (W), titanium (Ti), nickel (Ni), tin (Sn), aluminum (Al) or another metal or material suitable for providing a low resistance electrical connection between IC structure elements, i.e., a resistance level below a predetermined threshold corresponding to one or more tolerance levels of a resistance-based effect on circuit performance. In some embodiments, metal regions MR1-MR11 at least partially define metal segments MS1-MS11 as segments of a first metal layer of a manufacturing process.

Back-side power distribution structure BSPD, also referred to as a power distribution network BSPD in some embodiments, includes a plurality of conductive segments supported and electrically separated by a plurality of insulation layers and arranged in accordance with power delivery requirements, e.g., of one or more IC devices corresponding to IC structure 100B. In various embodiments, power distribution structure BSPD includes one or a combination of a through-silicon via (TSV), a through-dielectric via (TDV), a power rail, e.g., a super power rail or a buried power rail, conductive segments arranged in a grid or mesh structure, or another arrangement suitable for distributing power to one or more IC devices.

Portion BSPDA of back-side power distribution structure BSPD is electrically isolated from portion BSPDB of back-side power distribution structure BSPD. In various embodiments, one of portions BSPDA or BSPDB is configured to carry a first one of a power supply voltage or a reference voltage, and the other of portions BSPDA or BSPDB is configured to carry a second one of the power supply voltage or the reference voltage. In various embodiments, one or both of portions BSPDA or BSPDB includes a power rail.

As depicted in FIG. 2A, active sheets AS1-AS4 overlap respective multiple instances of back-side via regions VR1-VR4 in IC layout diagram 100A, thereby corresponding to nano-sheets NS1-NS4 overlying respective multiple instances of via structures VS1-VS4 in IC structure 100B as depicted in FIG. 2B. In the embodiment depicted in FIG. 2B, each nano-sheet NS1-NS4 directly contacts the respective via structure VS1-VS4, via structures VS2 and VS3 thereby being configured to electrically connect nano-sheets NS2 and NS3 to portion BSPDA, and via structures VS1 and VS4 thereby being configured to electrically connect nano-sheets NS1 and NS4 to portion BSPDB. In some embodiments, IC structure 100B is otherwise configured, e.g., by including one or more conductive layers between some or all of nano-sheets NS1-NS4 and respective via structures VS1-VS4, so as to electrically connect each nano-sheet NS1-NS4 to the corresponding portion BSPDA or BSPDB.

As depicted in FIG. 2A, active sheets/nano-sheets AS1/NS1-AS4/NS4 have respective widths WA1-WA4 in the Y direction, and back-side via regions/via structures VR1/VS1-VR4/VS4 have respective widths WV1-WV4 in the Y direction. One or both of widths WA3 or WA4 has a value greater than that of one or both of widths WA1 or WA2, and one or both of widths WV3 or WV4 has a value greater than that of one or both of widths WV1 or WV2. In some embodiments, the one or both of widths WA3 or WA4 having the value greater than that of the one or both of widths WA1 or WA2 corresponds to the one or both of widths WV3 or WV4 having the value greater than that of the one or both of widths WV1 or WV2. In some embodiments, each of widths WA3 and WA4 has a value greater than that of each of widths WA1 and WA2, and each of widths WV3 and WV4 has a value greater than that of each of widths WV1 and WV2. In some embodiments, widths WA3 and WA4 having values greater than those of widths WA1 and WA2 corresponds to row RB including timing-critical transistors of one or more IC devices.

In the embodiment depicted in FIGS. 2A and 2B, widths WV1-WV4 correspond to locations at which via structures VS1-VS4 contact nano-sheets NS1-NS4. In some embodiments, widths WV1-WV4 correspond to locations other than those at which via structures VS1-VS4 contact nano-sheets NS1-NS4, e.g., locations at which via structures VS1-VS4 contact one or more conductive layers positioned between via structures VS1-VS4 and nano-sheets NS1-NS4.

In the embodiment depicted in FIGS. 2A and 2B, widths WA1-WA4 have values greater than those of respective widths WV1-WV4. In some embodiments, one or more of widths WV1-WV4 has a value greater than that of one or more respective widths WA1-WA4.

In some embodiments, widths WV1-WV4 have values that are proportional to those of respective widths WA1-WA4. In some embodiments, a given width WV1-WV4 has a value relative to a value of the respective width WA1-WA4 ranging from 80 percent to 110 percent. In some embodiments, a given width WV1-WV4 has a value relative to a value of the respective width WA1-WA4 ranging from 90 percent to 95 percent.

In the embodiment depicted in FIGS. 2A and 2B, widths WA1 and WA2 have a same value, widths WV1 and WV2 have a same value, widths WA3 and WA4 have a same value, and widths WV1 and WV2 have a same value. In various embodiments, width WA1 has a value different from that of width WA2, width WV1 has a value different from that of width WV2, width WA3 has a value different from that of width WA4, and/or width WV3 has a value different from that of WV4.

In the embodiment depicted in FIG. 2A, each of widths WA1-WA4 has a constant value with respect to locations along the X direction such that each of active sheets/nano-sheets AS1/NS1-AS4/NS4 has a rectangular shape. In some embodiments, one or more of widths WA1-WA4 has multiple values with respect to locations along the X direction such that the corresponding one or more of active sheets/nano-sheets AS1/NS1-AS4/NS4 has a shape other than rectangular, e.g., a series of rectangles such as those discussed below with respect to FIGS. 4A-5.

In the embodiment depicted in FIG. 2A, each instance of each of widths WV1-WV4 has a same value with respect to locations along the X direction. In some embodiments, one or more of widths WV1-WV4 has multiple values with respect to locations along the X direction. In some embodiments, one or more of widths WV1-WV4 has multiple values with respect to locations along the X direction corresponding to multiple values of widths WA1-WA4 with respect to locations along the X direction.

In the embodiment depicted in FIG. 2A, metal tracks TR1-TR11 of IC layout diagram 100A correspond to a first metal layer and have a track pitch TP, also referred to as a first metal track pitch in some embodiments. Each of rows RA and RB has a cell height CH equal to five times track pitch TP, row RA has a border RAB1 aligned with metal track TR1 and a border RAB2 aligned with metal track TR6, and row RB has a border RBB1 aligned with metal track TR6 and a border RBB2 aligned with metal track TR11. A border RAB2/RBB1 between rows RA and RB is thereby aligned with metal track TR6.

Metal regions MR1-MR11 are aligned with respective metal tracks TR1-TR11, metal region MR6 thereby overlapping each of rows RA and RB. In the embodiment depicted in FIG. 2A, in IC layout diagram 100A, metal regions MR6 and MR11 overlap respective active sheets AS3 and AS4 such that, in the corresponding IC structure 100B, metal segments MS6 and MS11 overlie respective nano-sheets NS3 and NS4 in the Z direction, as depicted in FIGS. 2A-2C. In some embodiments, one or both of metal region MR6 abuts active sheet AS3 or metal region MR11 abuts active sheet AS4 such that the one or both of metal segments MS6 or MS11 has an edge aligned with an edge of the respective one or both of nano-sheets NS3 or NS4. In some embodiments, one or both of metal region MR6 does not overlap or abut active sheet AS3 or metal region MR11 does not overlap or abut active sheet AS4 such that the one or both of metal segments MS6 or MS11 does not overlie or align with the respective one or both of nano-sheets NS3 or NS4.

In the embodiment depicted in FIGS. 2A-2C, each of three metal regions MR6-MR8 overlaps active sheet AS3 such that each of the three corresponding metal segments MS6-MS8 overlies nano-sheet NS3, and each of three metal regions MR9-MR11 overlaps active sheet AS4 such that each of the three corresponding metal segments MS9-MS11 overlies nano-sheet NS4. In some embodiments, fewer than three metal regions overlap one or both of active sheets AS3 or AS4 such that fewer than three corresponding metal segments overlap the corresponding one or both of nano-sheets NS3 or NS4.

In the embodiment depicted in FIGS. 2A-2C, each of widths WA3, WA4, WV3, and WV4 has a value greater than 1.5 times track pitch TP such that a sum of the values of widths WA3 and WA4 is greater than three times track pitch TP and a sum of the values of widths WV3 and WV4 is greater than three times track pitch TP. In some embodiments, one or more of the values of widths WA3, WA4, WV3, and WV4 is less than or equal to 1.5 times track pitch TP. In some embodiments, a sum of the values of widths WA3 and WA4 is less than or equal to three times track pitch TP and/or a sum of the values of widths WV3 and WV4 is less than or equal to three times track pitch TP.

In the embodiment depicted in FIGS. 2A-2C, multiple instances of MD regions MDR extend in the Y direction and overlap each of active sheets AS1-AS4 such that corresponding instances of MD segments MDS overlie each of nano-sheets NS1-NS4. Each instance of MD region MDR depicted in FIG. 2B overlaps a single one of active sheets AS1-AS4 and a corresponding single one of back-side via regions VR1-VR4 such that each corresponding instance of MD segment MDS overlies a single one of nano-sheets NS1-NS4 and a corresponding single one of via structures VS1-VS4. A first instance of MD region MDR depicted in FIG. 2C overlaps active sheets AS1 and AS2 such that the corresponding instance of MD segment MDS overlies nano-sheets NS1 and NS2, and a second instance of MD region MDR depicted in FIG. 2C overlaps active sheets AS3 and AS4 such that the corresponding instance of MD segment MDS overlies nano-sheets NS3 and NS4.

In the embodiment depicted in FIGS. 2A-2C, instances of MD regions MDR have edges (not labeled) separated from a given one of border RAB1, RAB2/RBB1, or RBB2 by a distance, e.g., distance D1 discussed above with respect to FIG. 1B, such that the edges of each instance of MD regions/segments MDR/MDS are aligned along the X direction. In some embodiments, IC layout diagram 100A includes one or more instances of MD regions MDR otherwise configured such that the edges of each instance of MD regions MDR/MDS are not aligned along the X direction.

As depicted in FIG. 2B, based on back side-via region VR1 overlapping active sheet AS1, via structure VS1 extends from nano-sheet NS1 to portion BSPDB at back-side surface 100BS, and is thereby configured to electrically connect nano-sheet NS1 to portion BSPDB such that a first one of the power supply or reference voltage carried on portion BSPDB is received at nano-sheet NS1. Based on back side-via region VR2 overlapping active sheet AS2, via structure VS2 extends from nano-sheet NS2 to portion BSPDA at back-side surface 100BS, and is thereby configured to electrically connect nano-sheet NS2 to portion BSPDA such that a second one of the power supply or reference voltage carried on portion BSPDA is received at nano-sheet NS2. Based on back side-via region VR3 overlapping active sheet AS3, via structure VS3 extends from nano-sheet NS3 to portion BSPDA at back-side surface 100BS, and is thereby configured to electrically connect nano-sheet NS3 to portion BSPDA such that the second one of the power supply or reference voltage carried on portion BSPDA is received at nano-sheet NS3. Based on back side-via region VR4 overlapping active sheet AS4, via structure VS4 extends from nano-sheet NS4 to portion BSPDB at back-side surface 100BS, and is thereby configured to electrically connect nano-sheet NS4 to portion BSPDB such that the first one of the power supply or reference voltage carried on portion BSPDB is received at nano-sheet NS4.

In some embodiments, the instances of MD segments MDS that overlie via structures VS1-VS4 are included in S/D structures of one or more transistors. Because each of nano-sheets NS1-NS4 is configured to receive one of the power supply or reference voltages, IC structure 100B is free from including instances of first via structure V1S configured to electrically connect the corresponding instances of MD segment MDS to one or more of metal segments MS1-MS11.

Further, switching speed of the corresponding transistors increases with increasing values of widths WA1-WA4, and both resistance and power consumption of via structures VS1-VS4 decrease with increasing values of widths WV1-WV4. IC layout diagram 100A including active sheets AS1-AS4 having varying widths WA1-WA4 and back-side via regions VR1-VR4 having varying widths WV1-WV4 is thereby capable of causing IC structure 100B to include nano-sheets NS1-NS4 having varying widths WA1-WA4 and via structures VS1-VS4 having varying widths WV1-WV4. The ability to flexibly configure transistor size and power delivery so as to address varying timing and power requirements is thereby improved compared to approaches in which both nano-sheet and via structure widths are not similarly varied.

As depicted in FIG. 2C, the instance of MD segment MDS overlying each of nano-sheets NS1 and NS2 is configured to electrically connect nano-sheets NS1 and NS2 to each other, and an instance of first via structure V1S is configured to electrically connect each of nano-sheets NS1 and NS2 to metal segment MS4. The instance of MD segment MDS overlying each of nano-sheets NS3 and NS4 is configured to electrically connect nano-sheets NS3 and NS4 to each other, and an instance of first via structure V1S is configured to electrically connect each of nano-sheets NS3 and NS4 to metal segment MS10. In some embodiments, the corresponding instances of MD segments MDS are included in S/D structures of one or more transistors.

In the embodiment depicted in FIGS. 2A-2C, back-side via regions/structures VR1/VS1-VR4/VS4 are aligned in the Y direction, e.g., along line A-A', and the instances of MD regions/segments MDR/MDS configured to electrically connect nano-sheets NS1 and NS2 to each other and NS3 and NS4 to each other are aligned in the Y direction, e.g., along line B-B'. In some embodiments, back-side via regions/structures VR1/VS1 and VR2/VS2 are aligned in the Y direction with the instances of MD regions/segments MDR/MDS configured to electrically connect nano-sheets NS3 and NS4 to each other, and back-side via regions/structures VR3/VS3 and VR4/VS4 are aligned in the Y direction with the instances of MD regions/segments MDR/MDS configured to electrically connect nano-sheets NS1 and NS2 to each other.

In the embodiments depicted in FIGS. 3A and 3B, IC layout diagram 100A and IC structure 100B include rows RA and RB and gate regions/structures GR1/GS1-GR9/GS9 (not labeled) discussed above with respect to FIGS. 1A-2C. Additional features of IC layout diagram 100A and IC structure 100B discussed above, e.g., distances S1-S3, are not depicted in FIGS. 3A and 3B for the purpose of illustration.

In each of the embodiments depicted in FIGS. 3A and 3B, widths WA1-WA4 (not labeled) and WV1-WV4 (not shown), discussed above with respect to FIGS. 1A-2C, have values that are constant with respect to locations along the X direction, widths WA1 and WA2 have a same value, widths WA3 and WA4 have a same value, widths WV1 and WV2 have a same value, and widths WV3 and WV4 have a same value.

In the embodiment depicted in FIG. 3A, a total of two instances of row RA are positioned between adjacent instances of row RB such that a number of instances of row RA relative to a number of instances of row RB has a ratio of 2:1. In the embodiment depicted in FIG. 3B, a total of three instances of row RA are positioned between adjacent instances of row RB such that the number of instances of row RA relative to the number of instances of row RB has a ratio of 3:1. In various embodiments, IC layout diagram 100A and IC structure 100B include rows RA and RB similarly configured such that the number of instances of row RA relative to the number of instances of row RB has a ratio of 1:1 or greater than 3:1.

In the embodiments depicted in FIGS. 4A-4F, IC layout diagram 100A and IC structure 100B include rows RA-RC including active sheets/nano-sheets AS1/NS1-AS6/NS6, gate regions/structures GR1/GS1-GR9/GS9, and distances S1-S3 discussed above with respect to FIGS. 1A-2C. Each of FIGS. 4A-4F also includes a discontinuity J discussed below. Additional features of IC layout diagram 100A and IC structure 100B discussed above are not depicted, e.g., backside via regions/structures VR1/VS1-VR4/VS4 and widths WV1-WV4, or labeled, e.g., widths WA1-WA4, in FIGS. 4A-4F for the purpose of illustration.

In each of the embodiments depicted in FIGS. 4A-4F, two or more of active sheets/nano-sheets AS1/NS1-AS6/NS6 have sheet widths (not labeled), e.g., widths WA1-WA4, including a plurality of sheet width values with respect to locations along the X direction. Each sheet width value is uniform from a first one of gate regions/structures GR1/GS1-GR9/GS9 to a second one of gate regions/structures GR1/GS1-GR9/GS9. In the embodiments depicted in FIGS. 4A-4F, a total of one gate region/structure GR1/GS1-GR9/GS9 is positioned between the first and second gate regions/structures GR1/GS1-GR9/GS9 such that a given sheet width value corresponds to a single transistor positioned between the first and second gate regions/structures GR1/GS1-GR9/GS9. In various embodiments, a total of two or more gate region/structures GR1/GS1-GR9/GS9 are positioned between the first and second gate regions/structures GR1/GS1-GR9/GS9 such that a given sheet width value corresponds to two or more transistors positioned between the first and second gate regions/structures GR1/GS1-GR9/GS9.

In some embodiments, the plurality of sheet width values corresponds to a plurality of via width values, e.g., values of one of widths WV1-WV4, of a plurality of back-side via region/structures (not shown), e.g., backside via regions/structures VR1/VS1-VR4/VS4, such that each via region/structure corresponding to a given sheet width value has a same via width value. In some embodiments, each same via width value of the plurality of via width values is proportional to the corresponding sheet width value of the plurality of sheet width values, as discussed above with respect to widths WV1-WV4 and WA1-WA4.

At gate regions/structures GR1/GS1-GR9/GS9 corresponding to transitions between two different sheet width values, the corresponding active sheet/nano-sheet AS1/NS1-AS6/NS6 includes one or two discontinuities J (a representative instance labeled in each of FIGS. 4A-4F) in the Y direction along one or both borders (not labeled) extending along the X direction. In some embodiments, a discontinuity J is also referred to as a jog J. In some embodiments, each instance of discontinuity J has a value equal to or less than a corresponding maximum active sheet/nano-sheet discontinuity value, e.g., a maximum sheet contour discontinuity rule of the process used to manufacture IC structure 100B based on IC layout diagram 100A.

In each of the embodiments depicted in FIGS. 4A-4F, IC layout diagram/structure 100A/100B including active sheets/nano-sheets AS1/NS1-AS6/NS6 having the two or more pluralities of sheet widths also includes entireties of active sheets/nano-sheets AS1/NS1-AS6/NS6 being separated by distances S1-S3 as discussed above with respect to FIGS. 1A and 1B.

In the embodiment depicted in FIG. 4A, row RB includes each of active sheets/nano-sheets AS3/NS3 and AS4/NS4 having a plurality of sheet width values with respect to locations along the X direction. At each location along the X direction, the sheet width value of active sheet/nano-sheet AS3/NS3 is the same as the sheet width value of active sheet/nano-sheet AS4/NS4.

Figure 4B:
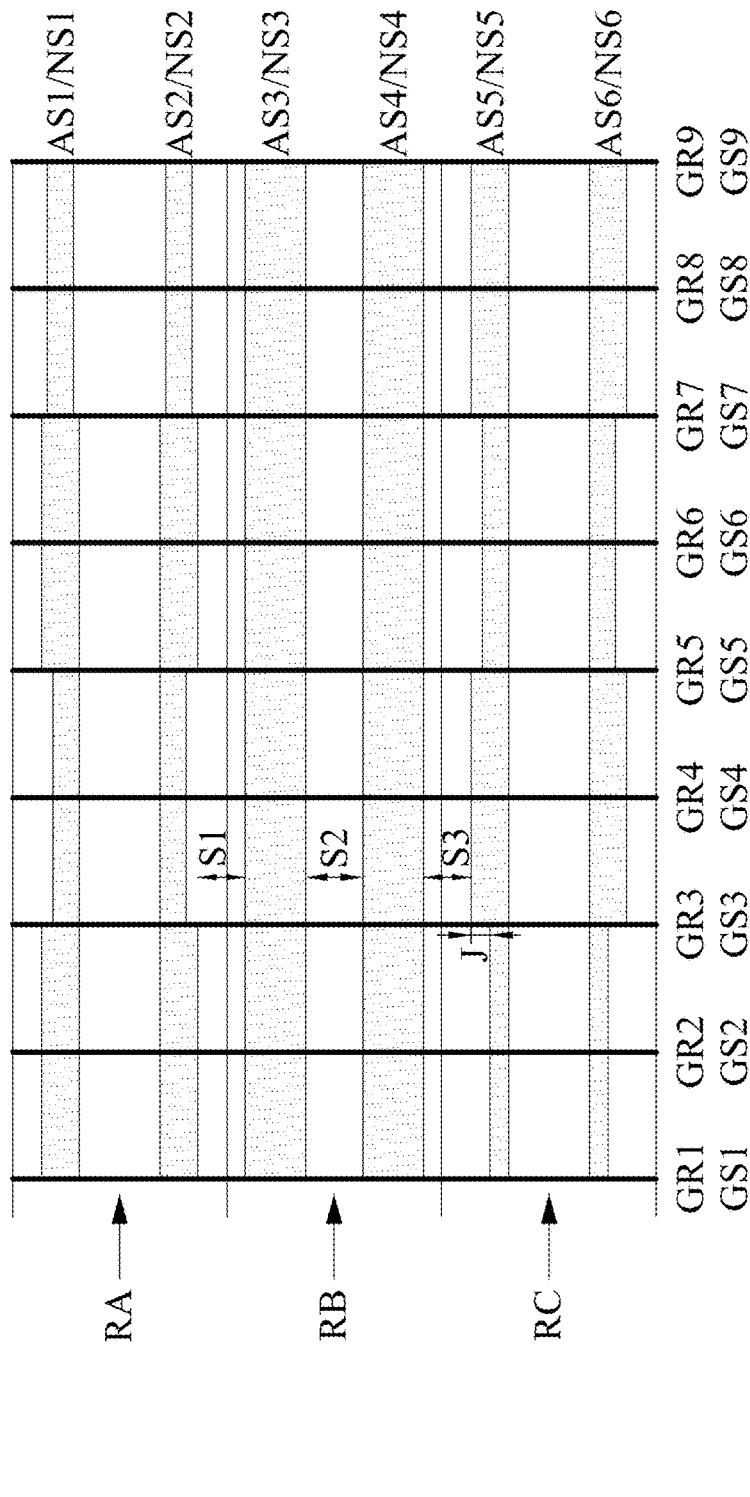
Figure 5:
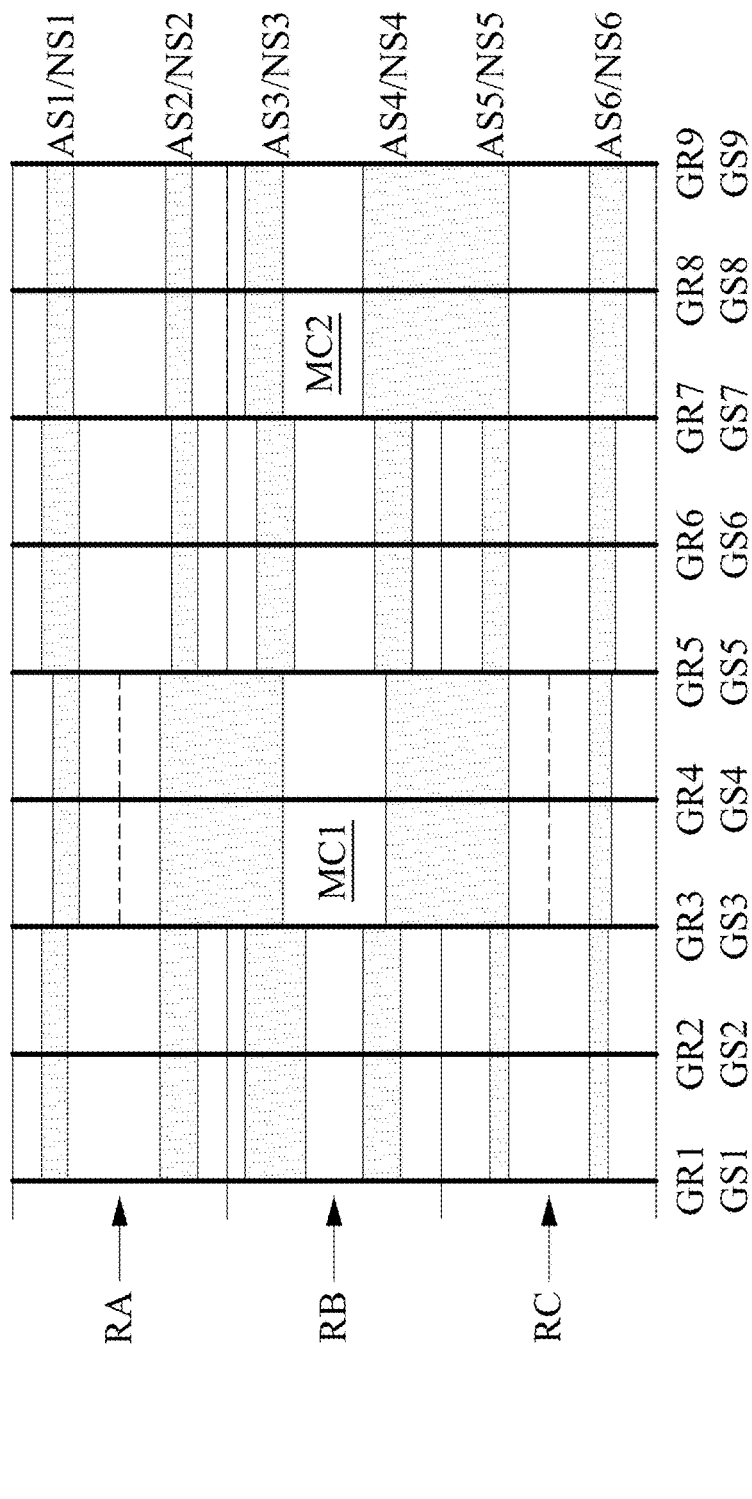
FIG. 5 is a diagram of an IC layout diagram and an IC structure, in accordance with some embodiments.

In the embodiment depicted in FIG. 4B, row RA includes each of active sheets/nano-sheets AS1/NS1 and AS2/NS2 and row RC includes active sheets/nano-sheets AS5/NS5 and AS6/NS6 having a plurality of sheet width values with respect to locations along the X direction. At each location along the X direction, the sheet width value of active sheet/nano-sheet AS1/NS1 is the same as the sheet width value of active sheet/nano-sheet AS2/NS2, and the sheet width value of active sheet/nano-sheet AS5/NS5 is the same as the sheet width value of active sheet/nano-sheet AS6/NS6.

Figure 4C:
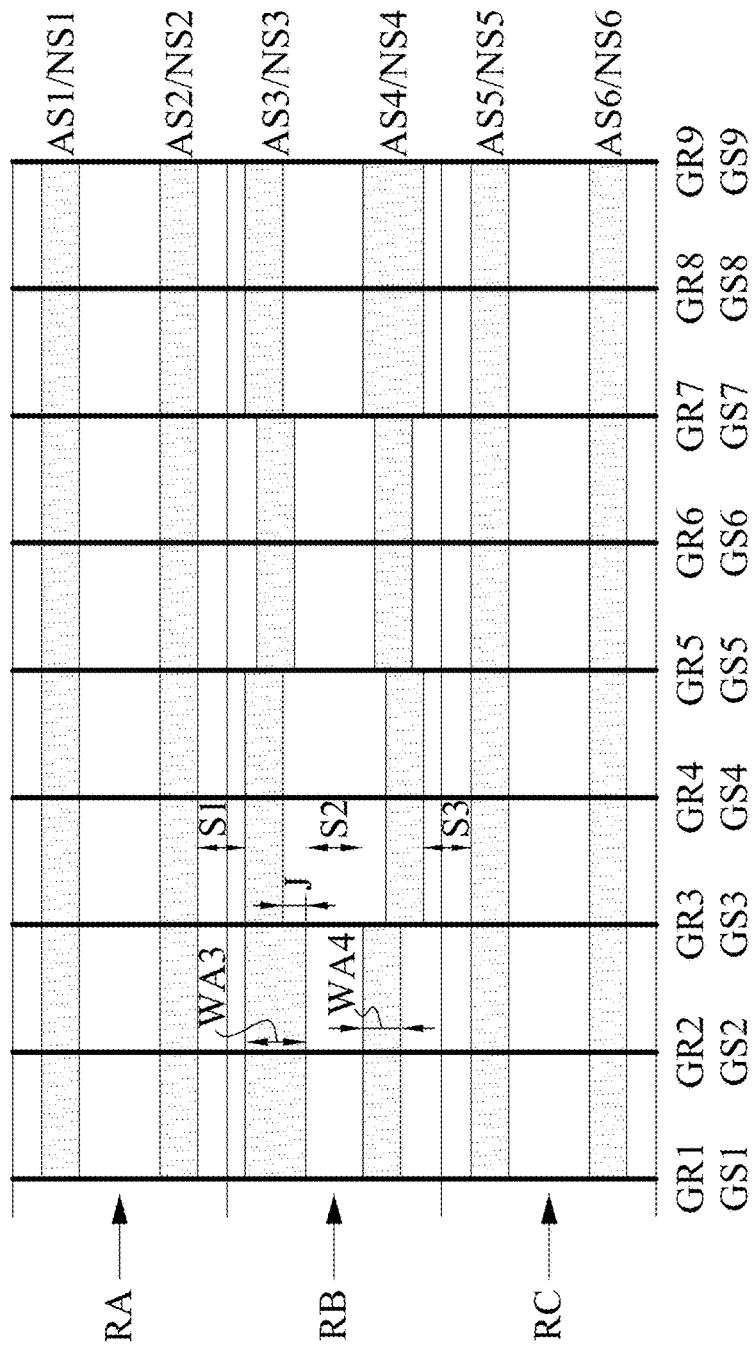

In the embodiment depicted in FIG. 4C, row RB includes each of active sheets/nano-sheets AS3/NS3 and AS4/NS4 having a plurality of sheet width values with respect to locations along the X direction. At one, some, or all of the locations along the X direction, e.g., a location X1, the value of sheet width WA3 of active sheet/nano-sheet AS3/NS3 is different from the value of sheet width WA4 of active sheet/nano-sheet AS4/NS4.

Figure 4D:
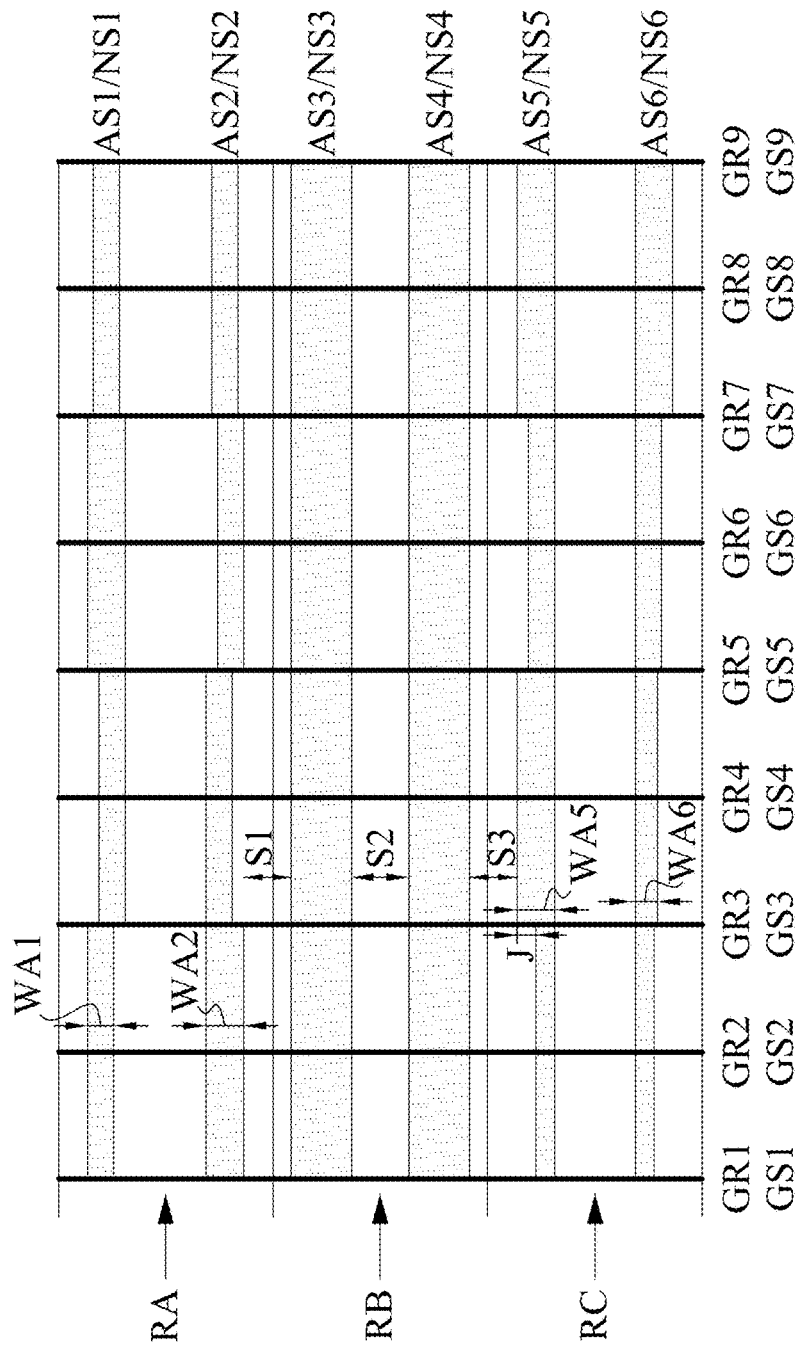

In the embodiment depicted in FIG. 4D, row RA includes each of active sheets/nano-sheets AS1/NS1 and AS2/NS2 and row RC includes active sheets/nano-sheets AS5/NS5 and AS6/NS6 having a plurality of sheet width values with respect to locations along the X direction. At one, some, or all of the locations along the X direction, e.g., location X1, the value of sheet width WA1 of active sheet/nano-sheet AS1/NS1 is different from the value of sheet width WA2 of active sheet/nano-sheet AS2/NS2, and/or the value of a sheet width WA5 of active sheet/nano-sheet AS5/NS5 is different from the value of a sheet width WA6 of active sheet/nano-sheet AS6/NS6, e.g., at a location X2.

Figure 4E:
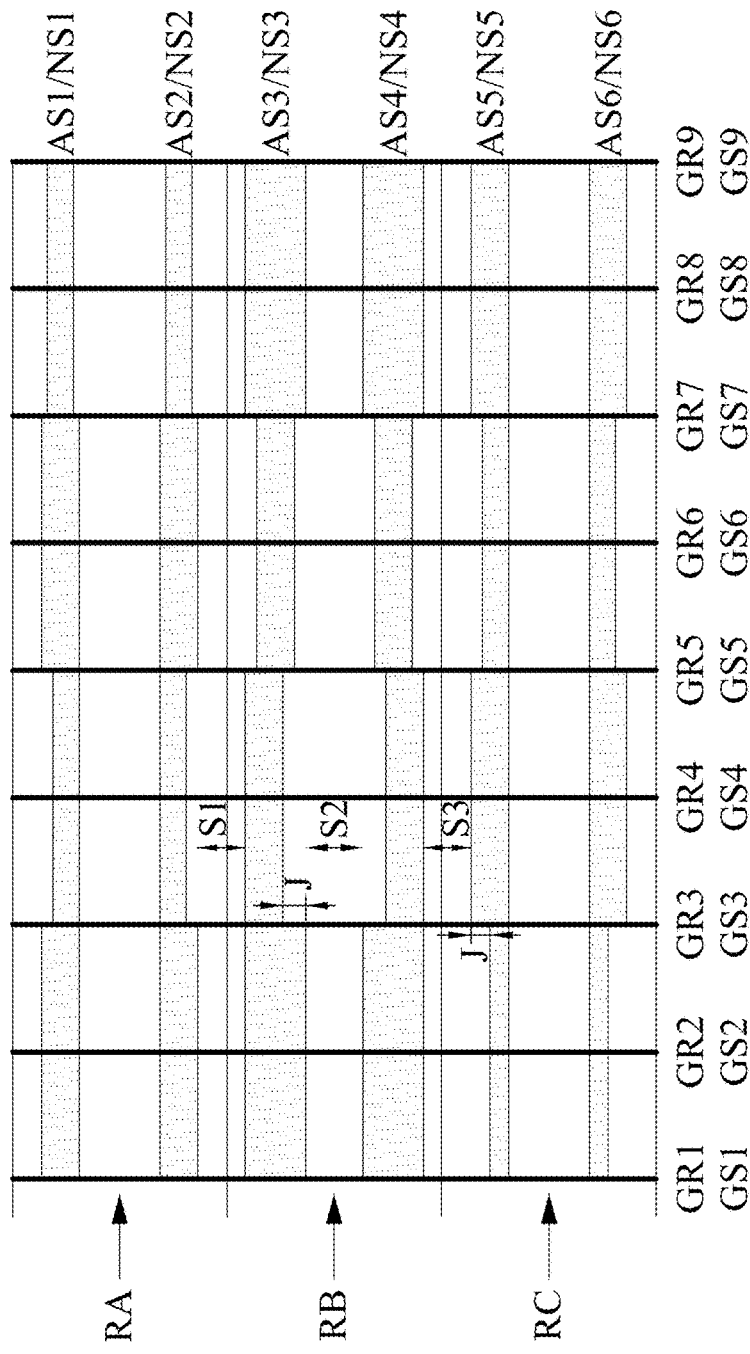

In the embodiment depicted in FIG. 4E, rows RA-RC include each of active sheets/nano-sheets AS1/NS1-AS6/NS6 having a plurality of sheet width values with respect to locations along the X direction. At each location along the X direction, the sheet width value of active sheet/nano-sheet AS1/NS1 is the same as the sheet width value of active sheet/nano-sheet AS2/NS2, the sheet width value of active sheet/nano-sheet AS3/NS3 is the same as the sheet width value of active sheet/nano-sheet AS4/NS4, and the sheet width value of active sheet/nano-sheet AS5/NS5 is the same as the sheet width value of active sheet/nano-sheet AS6/NS6.

Figure 4F:
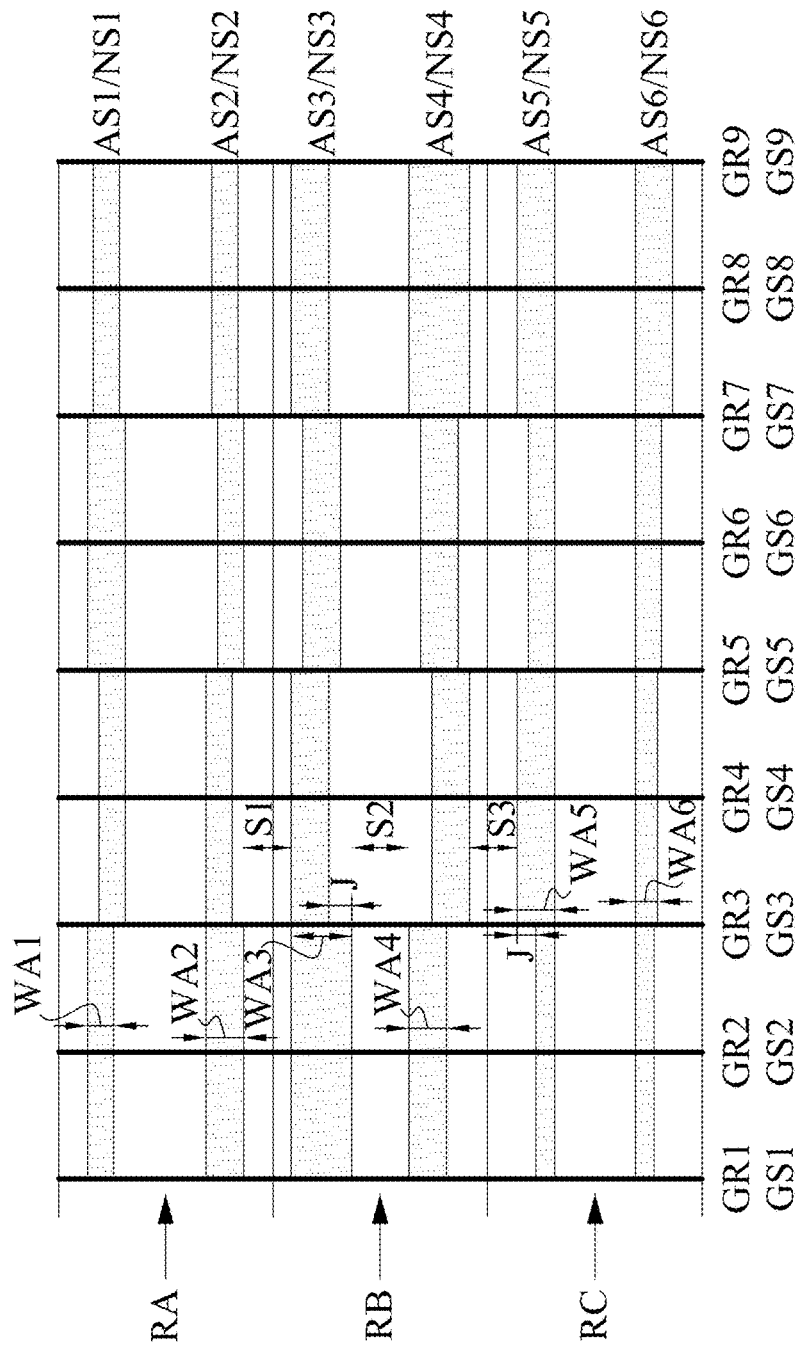

In the embodiment depicted in FIG. 4F, rows RA-RC include each of active sheets/nano-sheets AS1/NS1-AS6/NS6 having a plurality of sheet width values with respect to locations along the X direction. At one, some, or all of the locations along the X direction, the value of sheet width WA1 of active sheet/nano-sheet AS1/NS1 is different from the value of sheet width WA2 of active sheet/nano-sheet AS2/NS2, e.g., at location X1, the value of sheet width WA3 of active sheet/nano-sheet AS3/NS3 is different from the value of sheet width WA4 of active sheet/nano-sheet AS4/NS4, e.g., at location X1, and/or the value of sheet width WA5 of active sheet/nano-sheet AS5/NS5 is different from the value of sheet width WA6 of active sheet/nano-sheet AS6/NS6, e.g., at location X2.

In the embodiment depicted in FIG. 5, IC layout diagram 100A and IC structure 100B include rows RA-RC including active sheets/nano-sheets AS1/NS1-AS6/NS6, and gate regions/structures GR1/GS1-GR9/GS9, discussed above with respect to FIGS. 1-2C. In various embodiments corresponding to the embodiment depicted in FIG. 5, rows RA-RC include active sheets/nano-sheets AS1/NS1-AS6/NS6 configured in accordance with one of the embodiments depicted in FIGS. 4A-4F. In the embodiment depicted in FIG. 5, IC layout diagram 100A and IC structure 100B also include multi-row cells MC1 and MC2. Additional features of IC layout diagram 100A and IC structure 100B discussed above are not depicted in FIG. 5 for the purpose of illustration.

Each of multi-row cells MC1 and MC2 extends beyond a single row in the Y direction. Multi-row cell MC1 extends across a portion of row RA, an entirety of row RB, and a portion of row RC from gate region GR3 to gate region GR5, and multi-row cell MC2 extends across an entirety of row RB and an entirety of row RC from gate region GR7 to gate region GR9.

In multi-row cell MC1, active sheet AS2 of row RA is merged with adjacent active sheet AS3 of row RB such that nano-sheets NS2 and NS3 are continuous from gate structure GS3 to gate structure GS5, and active sheet AS4 of row RB is merged with adjacent active sheet AS5 of row RC such that nano-sheets NS4 and NS5 are continuous from gate structure GS3 to gate structure GS5. In multi-row cell MC2, active sheet AS4 of row RB is merged with adjacent active sheet AS5 of row RC such that nano-sheets NS4 and NS5 are continuous from gate structure GS7 to gate structure GS9.

Multi-row cells MC1 and MC2 depicted in FIG. 5 are non-limiting examples of multi-row cells provided for illustration. In various embodiments, IC layout diagram 100A includes one or more multi-row cells having one or more configurations other than those depicted in FIG. 5, e.g., a multi-row cell in which adjacent active sheets are not merged such that corresponding nano-sheets are continuous.

In each of the embodiments depicted in FIGS. 3A-5 and discussed above, IC layout diagram 100A and IC structure 100B include active sheets/nano-sheets and back-side via regions/structures having widths that vary as discussed such that IC layout diagram 100A and IC structure 100B are capable of realizing the benefits discussed above with respect to FIGS. 1A-2C.

Figure 6:
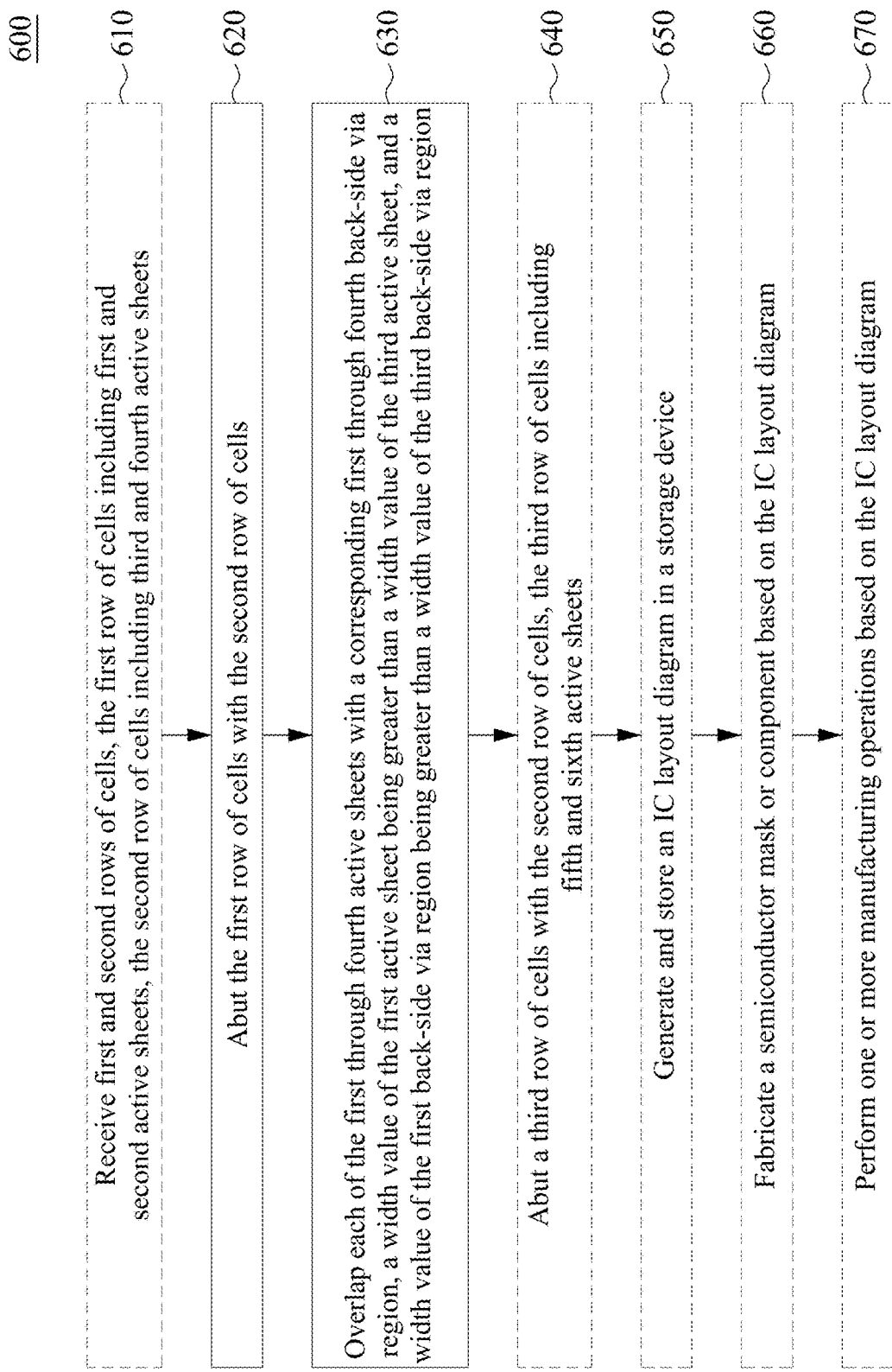
FIG. 6 is a flowchart of a method of generating an IC layout diagram, in accordance with some embodiments.

FIG. 6 is a flowchart of a method 600 of generating an IC layout diagram, in accordance with some embodiments. In some embodiments, generating the IC layout diagram includes generating an IC layout diagram, e.g., an IC layout diagram 100A corresponding to an IC structure 100B manufactured based on the generated IC layout diagram, each discussed above with respect to FIGS. 1A-5. Non-limiting examples of IC devices based on IC structure 100B include logic devices, flip-flops, multiplexers, processing devices, signal processing circuits, or the like.

In some embodiments, some or all of method 600 is executed by a processor of a computer. In some embodiments, some or all of method 600 is executed by a processor 802 of an IC layout diagram generation system 800, discussed below with respect to FIG. 8.

Some or all of the operations of method 600 are capable of being performed as part of a design procedure performed in a design house, e.g., a design house 920 discussed below with respect to FIG. 9.

In some embodiments, the operations of method 600 are performed in the order depicted in FIG. 6. In some embodiments, the operations of method 600 are performed simultaneously and/or in an order other than the order depicted in FIG. 6. In some embodiments, one or more operations are performed before, between, during, and/or after performing one or more operations of method 600.

At operation 610, in some embodiments, first and second rows of cells are received, the first row of cells including first and second active sheets, the second row of cells including third and fourth active sheets. Each of the active sheets extends along a row direction and has a width in a width direction perpendicular to the row direction, also referred to as a cell height direction, and each width has a width value. In various embodiments, one or more of the width values of a given width is one width value of a plurality of width values of the given width.

At least one of the width values of an active sheet in the first row is greater than at least one of the width values of an active sheet of the second row. In some embodiments, receiving the first row having at least one of the width values greater than at least one of the width values of the second row includes the first row of cells corresponding to a timing-critical circuit application.

In various embodiments, receiving the first and second rows of cells includes receiving two or more of rows RA-RD of IC layout diagram 100A discussed above with respect to FIGS. 1A-5.

At operation 620, the first row of cells is abutted with the second row of cells. In some embodiments, abutting the first row of cells with the second row of cells includes abutting row RA with row RB of IC layout diagram 100A discussed above with respect to FIGS. 1A-5.

In some embodiments, abutting the first row of cells with the second row of cells includes aligning each of the first and second rows of cells along a first metal track, i.e., aligning a border between the first row of cells and the second row of cells along the first metal track. In some embodiments, abutting the first row of cells with the second row of cells includes aligning rows RA and RB along metal track TR6 discussed above with respect to FIG. 2A.

In some embodiments, aligning each of the first and second rows of cells along the first metal track includes aligning a first metal region along the first metal track. In some embodiments, aligning the first metal region along the first metal track includes overlapping the second active sheet with the first metal region. In some embodiments, the first metal track is one first metal track of a plurality of first metal tracks having a first metal track pitch, each of the first row of cells and the second row of cells has a cell height in the width direction equal to five times the first metal track pitch, and a sum of values of the first and second sheet widths is greater than three times the first metal track pitch. In some embodiments, aligning the first metal region along the first metal track includes aligning metal region MR6 along metal track TR6 discussed above with respect to FIGS. 2A-2C.

In some embodiments, a multi-row cell is included in each of the first row of cells and the second row of cells, and abutting the first row of cells with the second row of cells includes merging the second active sheet with the third active sheet. In some embodiments, merging the second active sheet with the third active sheet includes merging a first one of active sheets AS1-AS6 with a second one of active sheets AS1-AS6 as discussed above with respect to FIG. 5.

At operation 630, each of the first through fourth active sheets is overlapped with a corresponding first through fourth back-side via region, a width value of the first active sheet being greater than a width value of the third active sheet, and a width value of the first back-side via region being greater than a width value of the third back-side via region. In various embodiments, overlapping each of the first through fourth active sheets with the corresponding first through fourth back-side via region includes overlapping active sheets AA1-AS4 with the corresponding back-side via regions VR1-VR4 of IC layout diagram 100A in accordance with the various embodiments discussed above with respect to FIGS. 1A-5.

In some embodiments, overlapping each of the first through fourth active sheets with the corresponding first through fourth back-side via regions includes intersecting the first row of cells and the second row of cells with a plurality of gate regions extending in the cell height direction, each sheet width value of a plurality of sheet width values being uniform from a first gate region of the plurality of gate regions to a second gate region of the plurality of gate regions. In some embodiments, intersecting the first row of cells and the second row of cells with the plurality of gate regions includes intersecting rows RA and RB with gate regions GR1-GR9 discussed above with respect to FIGS. 1A-5.

In some embodiments, back-side via regions are included in each of the first and second rows of cells, and abutting the first row of cells with the second row of cells in operation 620 includes abutting the first row of cells including first overlapped back-side via regions with the second row of cells including second overlapped back-side via regions.

At operation 640, in some embodiments, a third row of cells is abutted with the second row of cells, the third row of cells including fifth and sixth active sheets. In some embodiments, abutting the third row of cells with the second row of cells includes abutting row RC with row RB of IC layout diagram 100A as discussed above with respect to FIGS. 1A-2C and 4A-5. In some embodiments, abutting the third row of cells with the second row of cells includes abutting a second or greater number instance of row RA with row RB or a first or greater number instance of row RA of IC layout diagram 100A as discussed above with respect to FIGS. 3A and 3B.

At operation 650, in some embodiments, the IC layout diagram is generated and stored in a storage device. Generating the IC layout diagram is performed by a processor, e.g., processor 802 of IC layout diagram generation system 800 discussed below with respect to FIG. 8.

In various embodiments, storing the IC layout diagram in the storage device includes storing the IC layout diagram in a non-volatile, computer-readable memory or a cell library, e.g., a database, and/or includes storing the IC layout diagram over a network. In various embodiments, storing the IC layout diagram in the storage device includes storing the IC layout diagram in cell library 807 and/or over network 814 of IC layout diagram generation system 800, discussed below with respect to FIG. 8.

In various embodiments, generating and storing the IC layout diagram includes generating and storing IC layout diagram 100A discussed above with respect to FIGS. 1A-5.

At operation 660, in some embodiments, at least one of one or more semiconductor masks, or at least one component in a layer of a semiconductor IC is fabricated based on the IC layout diagram. Fabricating one or more semiconductor masks or at least one component in a layer of a semiconductor IC is discussed below with respect to IC manufacturing system 900 and FIG. 9.

In various embodiments, fabricating one or more semiconductor masks or at least one component in the layer of the semiconductor IC is based on IC layout diagram 100A discussed above with respect to FIGS. 1A-5.

At operation 670, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed below with respect to FIG. 9.

In various embodiments, performing one or more manufacturing operations is based on IC layout diagram 100A discussed above with respect to FIGS. 1A-5.

By executing some or all of the operations of method 600, an IC layout diagram, e.g., IC layout diagram 100A, is generated in which active sheets and back-side via regions have varying widths such that the IC layout diagram is capable of realizing the benefits discussed above with respect to FIGS. 1A-5.

Figure 7:
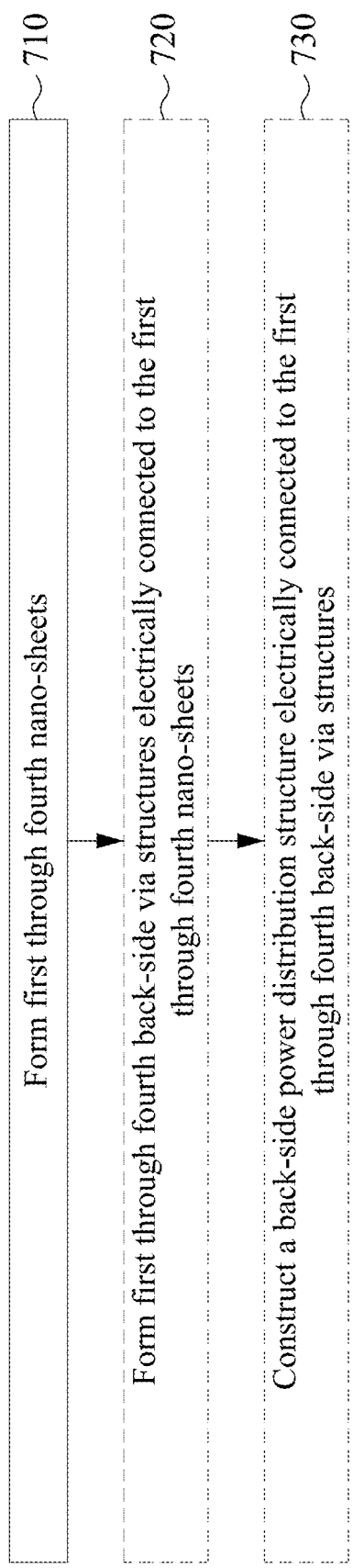
FIG. 7 is a flowchart of a method of manufacturing an IC structure, in accordance with some embodiments.

FIG. 7 is a flowchart of a method 700 of manufacturing an IC structure, in accordance with some embodiments.

Method 700 is operable to form an IC structure, e.g., IC structure 100B discussed above with respect to FIGS. 1A-5. In some embodiments, method 700 is usable by an IC manufacturing system as part of an IC manufacturing flow, e.g., IC manufacturing system 900 discussed below with respect to FIG. 900.

The sequence in which the operations of method 700 are depicted in FIG. 7 is for illustration only; the operations of method 700 are capable of being executed simultaneously and/or in sequences that differ from that depicted in FIG. 7. In some embodiments, operations in addition to those depicted in FIG. 7 are performed before, between, during, and/or after the operations depicted in FIG. 7.

In some embodiments, one or more operations of method 700 are executed using various fabrication tools, e.g., one or more of a wafer stepper, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed below.

At operation 710, first through fourth nano-sheets are formed. In various embodiments, forming the first through fourth nano-sheets includes forming nano-sheets NS1-NS4 of IC structure 100B in accordance with the various embodiments discussed above with respect to FIGS. 1A-5.

Forming nano-sheets includes using one or more suitable processes, e.g., photolithography, etch, and/or deposition processes. In some embodiments, the photolithography process includes forming and developing a photoresist layer to protect predetermined regions of the substrate while an etch process, e.g., a reactive ion etch, is used to form recesses in the substrate. In some embodiments, the deposition process includes performing an atomic layer deposition (ALD) in which one or more monolayers are deposited.

In some embodiments, forming the first through fourth nano-sheets includes forming one or more nano-sheets in addition to the first through fourth nano-sheets, e.g., nano-sheets NS5-NS8 discussed above with respect to FIGS. 1A-5.

In some embodiments forming the first through fourth nano-sheets include forming one or more additional structures on the first through fourth nano-sheets, e.g., one or more MD structures, S/D structures, via structures, gate structures, metal interconnect structures, or the like. In some embodiments, forming the first through fourth nano-sheets include forming one or more of MD segments MDS, via structures V1S, or gate structures GS1-GS9 discussed above with respect to FIGS. 1A-5.

At operation 720, first through fourth back-side via structures are formed, the first through fourth back-side via structures being electrically connected to the corresponding first through fourth nano-sheets. In some embodiments, forming the first through fourth back-side via structures includes forming via structures VS1-VS4 of IC structure 100B in accordance with the various embodiments discussed above with respect to FIGS. 1A-5.

Forming back-side via structures includes using one or more suitable processes, e.g., photolithography, etch, and/or deposition processes. In some embodiments, an etch process is used to form openings in the substrate, and a deposition process is used to fill the openings. In some embodiments, using the deposition process includes performing a chemical vapor deposition (CVD) in which one or more conductive materials are deposited.

In some embodiments, forming the first through fourth back-side via structures includes forming one or more back-side via structures in addition to the first through fourth back-side via structures, e.g., one of more of via structures VS5 or VS6 discussed above with respect to FIGS. 1A-5.

In some embodiments, forming the first through fourth back-side via structures includes forming one or more additional features, e.g., one or more conductive layers between the first through fourth nano-sheets and the first through fourth back-side via structures.

In some embodiments, forming the first through fourth back-side via structures includes performing a thinning operation on a semiconductor wafer including the IC structure, e.g., substrate 100S discussed above with respect to FIGS. 1A-5.

At operation 730, a back-side power distribution structure electrically connected to the firth through fourth back-side vias is constructed. In some embodiments, constructing the back-side power distribution structure includes constructing back-side power distribution structure BSPD of IC structure 100B in accordance with the various embodiments discussed above with respect to FIGS. 1A-5.

Constructing a back-side power distribution structure includes forming a plurality of conductive segments supported and electrically separated by one or more insulation layers. In some embodiments, forming the one or more insulation layers includes depositing one or more insulation materials, e.g., dielectric materials, discussed above with respect to FIGS. 1A-2C. In some embodiments, forming the conductive segments includes performing one or more deposition processes to deposit one or more conductive materials as discussed above with respect to FIGS. 1A-2C.

In some embodiments, configuring the plurality of conductive segments includes performing one or more manufacturing processes, e.g., one or more deposition, patterning, etching, planarization, and/or cleaning processes, suitable for creating conductive structures arranged in accordance with power distribution requirements.

In some embodiments, constructing the back-side power distribution structure includes including the IC structure in an IC package, e.g., a 3D or fanout package.

The operations of method 700 are usable to form an IC structure, e.g., IC structure 100B, that includes nano-sheets and via structures having varying widths such that the IC structure diagram is capable of realizing the benefits discussed above with respect to FIGS. 1A-5.

Figure 8:
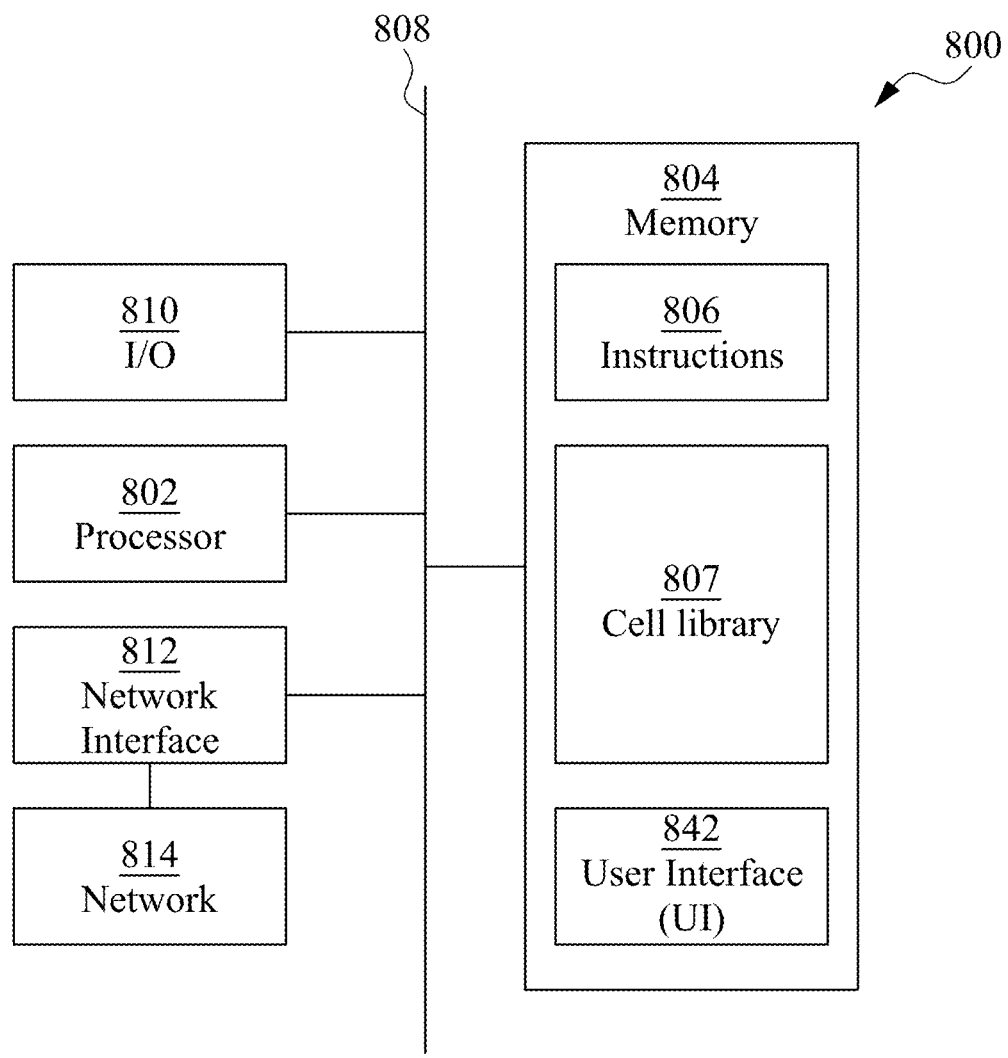
FIG. 8 is a block diagram of an IC layout diagram generation system, in accordance with some embodiments.

FIG. 8 is a block diagram of IC layout diagram generation system 800, in accordance with some embodiments. Methods described herein of designing IC layout diagrams in accordance with one or more embodiments are implementable, for example, using IC layout diagram generation system 800, in accordance with some embodiments.

In some embodiments, IC layout diagram generation system 800 is a general purpose computing device including a hardware processor 802 and a non-transitory, computer-readable storage medium 804. Storage medium 804, amongst other things, is encoded with, i.e., stores, computer program code 806, i.e., a set of executable instructions. Execution of instructions 806 by hardware processor 802 represents (at least in part) an EDA tool which implements a portion or all of a method, e.g., method 600 of generating an IC layout diagram described above with respect to FIGS. 1A-6 (hereinafter, the noted processes and/or methods).

Processor 802 is electrically coupled to computer-readable storage medium 804 via a bus 808. Processor 802 is also electrically coupled to an I/O interface 810 by bus 808. A network interface 812 is also electrically connected to processor 802 via bus 808. Network interface 812 is connected to a network 814, so that processor 802 and computer-readable storage medium 804 are capable of connecting to external elements via network 814. Processor 802 is configured to execute computer program code 806 encoded in computer-readable storage medium 804 in order to cause IC layout diagram generation system 800 to be usable for performing a portion or all of the noted processes and/or methods. In one or more embodiments, processor 802 is a central processing unit (CPU), a multi-processor, a distributed processing system, an application specific integrated circuit (ASIC), and/or a suitable processing unit.

In one or more embodiments, computer-readable storage medium 804 is an electronic, magnetic, optical, electromagnetic, infrared, and/or a semiconductor system (or apparatus or device). For example, computer-readable storage medium 804 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 804 includes a compact disk-read only memory (CD-ROM), a compact disk-read/write (CD-R/W), and/or a digital video disc (DVD).

In one or more embodiments, storage medium 804 stores computer program code 806 configured to cause IC layout diagram generation system 800 (where such execution represents (at least in part) the EDA tool) to be usable for performing a portion or all of the noted processes and/or methods. In one or more embodiments, storage medium 804 also stores information which facilitates performing a portion or all of the noted processes and/or methods. In one or more embodiments, storage medium 804 stores cell library 807 of cells including such cells as disclosed herein, e.g., rows of cells RA-RD discussed above with respect to FIGS. 1A-6.

IC layout diagram generation system 800 includes I/O interface 810. I/O interface 810 is coupled to external circuitry. In one or more embodiments, I/O interface 810 includes a keyboard, keypad, mouse, trackball, trackpad, touchscreen, and/or cursor direction keys for communicating information and commands to processor 802.

IC layout diagram generation system 800 also includes network interface 812 coupled to processor 802. Network interface 812 allows system 800 to communicate with network 814, to which one or more other computer systems are connected. Network interface 812 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more IC layout diagram generation systems 800.

IC layout diagram generation system 800 is configured to receive information through I/O interface 810. The information received through I/O interface 810 includes one or more of instructions, data, design rules, libraries of standard cells, and/or other parameters for processing by processor 802. The information is transferred to processor 802 via bus 808. IC layout diagram generation system 800 is configured to receive information related to a UI through I/O interface 810. The information is stored in computer-readable medium 804 as user interface (UI) 842.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by IC layout diagram generation system 800. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 9:
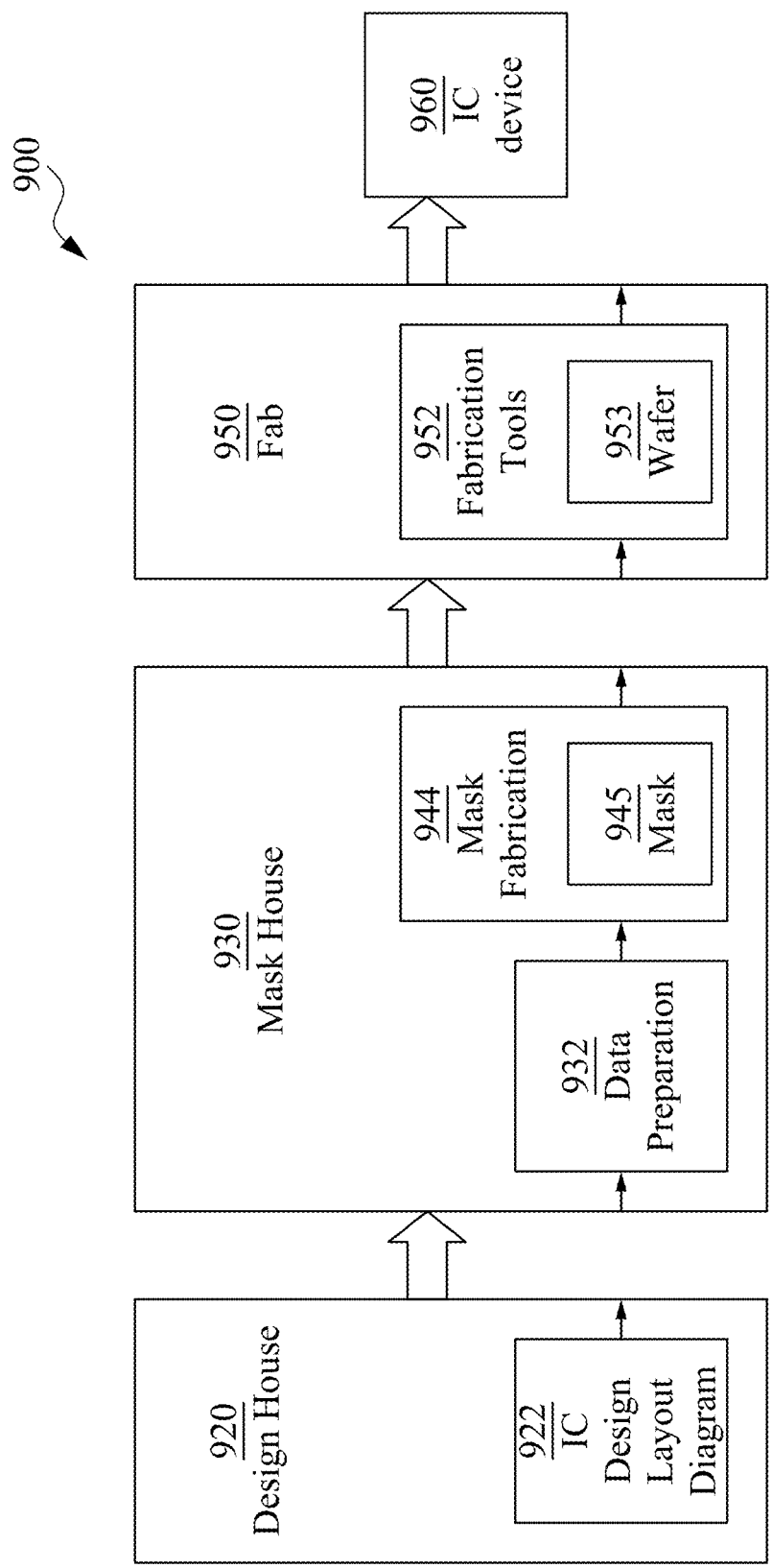
FIG. 9 is a block diagram of an IC manufacturing system, and an IC manufacturing flow associated therewith, in accordance with some embodiments.

FIG. 9 is a block diagram of IC manufacturing system 900, and an IC manufacturing flow associated therewith, in accordance with some embodiments. In some embodiments, based on an IC layout diagram, at least one of (A) one or more semiconductor masks or (B) at least one component in a layer of a semiconductor integrated circuit is fabricated using manufacturing system 900.

In FIG. 9, IC manufacturing system 900 includes entities, such as a design house 920, a mask house 930, and an IC manufacturer/fabricator ("fab") 950, that interact with one another in the design, development, and manufacturing cycles and/or services related to manufacturing an IC device 960. The entities in system 900 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 920, mask house 930, and IC fab 950 is owned by a single larger company. In some embodiments, two or more of design house 920, mask house 930, and IC fab 950 coexist in a common facility and use common resources.

Design house (or design team) 920 generates an IC design layout diagram 922. IC design layout diagram 922 includes various geometrical patterns, e.g., an IC layout diagram 100A discussed above with respect to FIGS. 1A-6. The geometrical patterns correspond to patterns of metal, oxide, or semiconductor layers that make up the various components of IC device 960 to be fabricated. The various layers combine to form various IC features. For example, a portion of IC design layout diagram 922 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 920 implements a proper design procedure to form IC design layout diagram 922. The design procedure includes one or more of logic design, physical design or place and route. IC design layout diagram 922 is presented in one or more data files having information of the geometrical patterns. For example, IC design layout diagram 922 can be expressed in a GDSII file format or DFII file format.

Mask house 930 includes data preparation 932 and mask fabrication 944. Mask house 930 uses IC design layout diagram 922 to manufacture one or more masks 945 to be used for fabricating the various layers of IC device 960 according to IC design layout diagram 922. Mask house 930 performs mask data preparation 932, where IC design layout diagram 922 is translated into a representative data file ("RDF"). Mask data preparation 932 provides the RDF to mask fabrication 944. Mask fabrication 944 includes a mask writer. A mask writer converts the RDF to an image on a substrate, such as a mask (reticle) 945 or a semiconductor wafer 953. The design layout diagram 922 is manipulated by mask data preparation 932 to comply with particular characteristics of the mask writer and/or requirements of IC fab 950. In FIG. 9, mask data preparation 932 and mask fabrication 944 are illustrated as separate elements. In some embodiments, mask data preparation 932 and mask fabrication 944 can be collectively referred to as mask data preparation.

In some embodiments, mask data preparation 932 includes optical proximity correction (OPC) which uses lithography enhancement techniques to compensate for image errors, such as those that can arise from diffraction, interference, other process effects and the like. OPC adjusts IC design layout diagram 922. In some embodiments, mask data preparation 932 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 932 includes a mask rule checker (MRC) that checks the IC design layout diagram 922 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 922 to compensate for limitations during mask fabrication 944, which may undo part of the modifications performed by OPC in order to meet mask creation rules.

In some embodiments, mask data preparation 932 includes lithography process checking (LPC) that simulates processing that will be implemented by IC fab 950 to fabricate IC device 960. LPC simulates this processing based on IC design layout diagram 922 to create a simulated manufactured device, such as IC device 960. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 922.

It should be understood that the above description of mask data preparation 932 has been simplified for the purposes of clarity. In some embodiments, data preparation 932 includes additional features such as a logic operation (LOP) to modify the IC design layout diagram 922 according to manufacturing rules. Additionally, the processes applied to IC design layout diagram 922 during data preparation 932 may be executed in a variety of different orders.

After mask data preparation 932 and during mask fabrication 944, a mask 945 or a group of masks 945 are fabricated based on the modified IC design layout diagram 922. In some embodiments, mask fabrication 944 includes performing one or more lithographic exposures based on IC design layout diagram 922. In some embodiments, an electron-beam (e-beam) or a mechanism of multiple e-beams is used to form a pattern on a mask (photomask or reticle) 945 based on the modified IC design layout diagram 922. Mask 945 can be formed in various technologies. In some embodiments, mask 945 is formed using binary technology. In some embodiments, a mask pattern includes opaque regions and transparent regions. A radiation beam, such as an ultraviolet (UV) or EUV beam, used to expose the image sensitive material layer (e.g., photoresist) which has been coated on a wafer, is blocked by the opaque region and transmits through the transparent regions. In one example, a binary mask version of mask 945 includes a transparent substrate (e.g., fused quartz) and an opaque material (e.g., chromium) coated in the opaque regions of the binary mask. In another example, mask 945 is formed using a phase shift technology. In a phase shift mask (PSM) version of mask 945, various features in the pattern formed on the phase shift mask are configured to have proper phase difference to enhance the resolution and imaging quality. In various examples, the phase shift mask can be attenuated PSM or alternating PSM. The mask(s) generated by mask fabrication 944 is used in a variety of processes. For example, such a mask(s) is used in an ion implantation process to form various doped regions in semiconductor wafer 953, in an etching process to form various etching regions in semiconductor wafer 953, and/or in other suitable processes.

IC fab 950 is an IC fabrication business that includes one or more manufacturing facilities for the fabrication of a variety of different IC products. In some embodiments, IC Fab 950 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 950 includes wafer fabrication tools 952 configured to execute various manufacturing operations on semiconductor wafer 953 such that IC device 960 is fabricated in accordance with the mask(s), e.g., mask 945. In various embodiments, fabrication tools 952 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 950 uses mask(s) 945 fabricated by mask house 930 to fabricate IC device 960. Thus, IC fab 950 at least indirectly uses IC design layout diagram 922 to fabricate IC device 960. In some embodiments, semiconductor wafer 953 is fabricated by IC fab 950 using mask(s) 945 to form IC device 960. In some embodiments, the IC fabrication includes performing one or more lithographic exposures based at least indirectly on IC design layout diagram 922. Semiconductor wafer 953 includes a silicon substrate or other proper substrate having material layers formed thereon. Semiconductor wafer 953 further includes one or more of various doped regions, dielectric features, multi-level interconnects, and the like (formed at subsequent manufacturing steps).

Details regarding an IC manufacturing system (e.g., system 900 of FIG. 9), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a method of generating an IC layout diagram includes abutting a first row of cells with a second row of cells along a border, the first row of cells including first and second active sheets extending along a row direction, the second row of cells including third and fourth active sheets extending along the row direction, and overlapping each of the first through fourth active sheets with a corresponding first through fourth back-side via region. Each of the first through fourth active sheets and first through fourth back-side via regions has a width in a width direction perpendicular to the row direction, the width having a width value, the width value of the first active sheet is greater than that of the third active sheet, the width value of the first back-side via region is greater than that of the third back-side via region, a distance from the first active sheet to the border has a value less than a minimum spacing rule for metal-like defined regions of a manufacturing process corresponding to the IC layout diagram, and at least one of the abutting the first row of cells with the second row of cells or the overlapping the first through fourth active sheets with the first through fourth back-side via regions is performed by a processor. In some embodiments, abutting the first row of cells with the second rows of cells includes aligning the border and a first metal region along a first metal track, and the first metal region abuts or overlaps the first active sheet. In some embodiments, each of the width values of the first through fourth active sheets is uniform with respect to locations along the row direction. In some embodiments, at least one of the width value of the first active sheet is different from that of the second active sheet, or the width value of the third active sheet is different from that of the fourth active sheet. In some embodiments, the method includes abutting a third row of cells with the second row of cells, the third row of cells including fifth and sixth active sheets, wherein a width value of the fifth active sheet is the same as that of the third active sheet, and a width value of the sixth active sheet is the same as that of the fourth active sheet. In some embodiments, at least one of the width value of the first active sheet is one width value of multiple width values of the width of the first active sheet, or the width value of the third active sheet is one width value of multiple width values of the width of the third active sheet.

In some embodiments, the width value of the first active sheet is one width value of multiple width values of the width of the first active sheet, and a width value of the second active sheet is one width value of multiple width values of the width of the second active sheet. In some embodiments, at each location along the row direction, each width value of the multiple width values of the first active sheet is the same as each width value of the multiple width values of the second active sheet. In some embodiments, a multi-row cell is included in each of the first row of cells and the second row of cells, and abutting the first row of cells with the second row of cells includes merging the first active sheet with the third active sheet.

In some embodiments, an IC layout generation system includes a processor and a non-transitory, computer readable storage medium including computer program code for one or more programs. The non-transitory, computer readable storage medium and the computer program code are configured to, with the processor, cause the system to align a border between a first row of cells and a second row of cells along a first metal track, wherein the first row of cells includes first and second active sheets extending parallel to the first metal track and having respective first and second sheet widths along a cell height direction perpendicular to the first metal track, the second row of cells includes third and fourth active sheets extending parallel to the first metal track and having respective third and fourth sheet widths along the cell height direction, a distance from the second active sheet to the first metal track has a value less than a minimum spacing rule for metal-like defined regions of a manufacturing process corresponding to the IC layout, and at least one of the first or second sheet widths has a value greater than that of one of the third or fourth sheet widths, overlap the first through fourth active sheets with corresponding first through fourth back-side via regions, the first through fourth back-side via regions having widths along the cell height direction proportional to the respective first through fourth sheet widths, and generate an IC layout file based on the first row of cells and the second row of cells. In some embodiments, the non-transitory, computer readable storage medium and the computer program code are configured to, with the processor, further cause the system to align a first metal region along the first metal track, thereby overlapping the second active sheet with the first metal region. In some embodiments, the non-transitory, computer readable storage medium and the computer program code are configured to, with the processor, further cause the system to overlap the first through fourth active sheets with the corresponding first through fourth back-side via regions by aligning the first through fourth back-side via regions along the cell height direction. In some embodiments, one of the first through fourth sheet widths includes multiple sheet width values. In some embodiments, the non-transitory, computer readable storage medium and the computer program code are configured to, with the processor, further cause the system to intersect the first row of cells and the second row of cells with a plurality of gate regions extending in the cell height direction, and each sheet width value of the multiple sheet width values is uniform from a first gate region of the plurality of gate regions to a second gate region of the plurality of gate regions. In some embodiments, the first metal track is one first metal track of a plurality of first metal tracks having a first metal track pitch, each of the first row of cells and the second row of cells has a cell height in the cell height direction equal to five times the first metal track pitch, and a sum of values of the first and second sheet widths is greater than three times the first metal track pitch.

In some embodiments, an IC structure includes first through fourth nano-sheet structures extending in a first direction and having respective first through fourth widths along a second direction perpendicular to the first direction, and first through fourth via structures electrically connected to corresponding ones of the first through fourth nano-sheet structures. The second width has a value greater than that of the third width, a width of the second via structure along the second direction has a value greater than that of a width of the third via structure along the second direction, the second and third nano-sheets are positioned between the first and fourth nano-sheets, the second and third via structures are configured to electrically connect the second and third nano-sheets to a first portion of a back-side power distribution structure configured to carry one of a power supply voltage or a reference voltage, and the first and fourth via structures are configured to electrically connect the first and fourth nano-sheets to a second portion of the back-side power distribution structure configured to carry the other of the power supply voltage or the reference voltage. In some embodiments, the IC structure includes a plurality of MD segments overlying the second nano-sheet, each MD segment of the plurality of MD segments extends along the second direction to an edge at a location between the second and third nano-sheets, and the edges of the plurality of MD segments are aligned in the first direction. In some embodiments, the second nano-sheet is continuous with the third nano-sheet. In some embodiments, one or more of the first width value is one first width value of multiple first width values of the width of the first nano-sheet, the second width value is one second width value of multiple second width values of the width of the second nano-sheet, the third width value is one third width value of multiple third width values of the width of the third nano-sheet, or the fourth width value is one fourth width value of multiple fourth width values of the width of the fourth nano-sheet. In some embodiments, the first through fourth via structures are aligned along the second direction.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method of generating an integrated circuit (IC) layout diagram, the method comprising:
   abutting a first row of cells with a second row of cells along a border, the first row of cells comprising first and second active sheets extending along a row direction, the second row of cells comprising third and fourth active sheets extending along the row direction; and
   overlapping each of the first through fourth active sheets with a corresponding first through fourth back-side via region,
   wherein
   each of the first through fourth active sheets and first through fourth back-side via regions has a width in a width direction perpendicular to the row direction, the width having a width value,
   the width value of the first active sheet is greater than that of the third active sheet,
   the width value of the first back-side via region is greater than that of the third back-side via region,
   a distance from the first active sheet to the border has a value less than a minimum spacing rule for metal-like defined regions of a manufacturing process corresponding to the IC layout diagram, and
   at least one of the abutting the first row of cells with the second row of cells or the overlapping the first through fourth active sheets with the first through fourth back-side via regions is performed by a processor.

2. The method of claim 1, wherein
   the abutting the first row of cells with the second rows of cells comprises aligning the border and a first metal region along a first metal track, and
   the first metal region abuts or overlaps the first active sheet.

3. The method of claim 1, wherein each of the width values of the first through fourth active sheets is uniform with respect to locations along the row direction.

4. The method of claim 3, wherein at least one of
   the width value of the first active sheet is different from that of the second active sheet, or
   the width value of the third active sheet is different from that of the fourth active sheet.

5. The method of claim 3, further comprising abutting a third row of cells with the second row of cells, the third row of cells comprising fifth and sixth active sheets, wherein
   a width value of the fifth active sheet is the same as that of the third active sheet, and
   a width value of the sixth active sheet is the same as that of the fourth active sheet.

6. The method of claim 1, wherein at least one of
   the width value of the first active sheet is one width value of multiple width values of the width of the first active sheet, or
   the width value of the third active sheet is one width value of multiple width values of the width of the third active sheet.

7. The method of claim 1, wherein
   the width value of the first active sheet is one width value of multiple width values of the width of the first active sheet, and
   a width value of the second active sheet is one width value of multiple width values of the width of the second active sheet.

8. The method of claim 7, wherein at each location along the row direction, each width value of the multiple width values of the first active sheet is the same as each width value of the multiple width values of the second active sheet.

9. The method of claim 1, wherein
   a multi-row cell is included in each of the first row of cells and the second row of cells, and
   the abutting the first row of cells with the second row of cells comprises merging the first active sheet with the third active sheet.

10. A method of generating an integrated circuit (IC) layout diagram, the method comprising:
    abutting a first row of cells with a second row of cells along a border, the first row of cells comprising first and second active sheets extending along a row direction, the second row of cells comprising third and fourth active sheets extending along the row direction;
    aligning the border along a first metal track of a plurality of metal tracks having a metal track pitch; and
    overlapping each of the first through fourth active sheets with a corresponding first through fourth back-side via region,
    wherein each of the first through fourth active sheets and first through fourth back-side via regions has a width in a width direction perpendicular to the row direction, the width having a width value, the width value of the first active sheet is greater than that of the third active sheet, the width value of the first back-side via region is greater than that of the third back-side via region, a distance from the first active sheet to the border has a value less than a minimum spacing rule for metal-like defined regions of a manufacturing process corresponding to the IC layout diagram, each of the first and second rows of cells has a height in the width direction equal to five times the metal track pitch, and at least one of the abutting the first row of cells with the second row of cells or the overlapping the first through fourth active sheets with the first through fourth back-side via regions is performed by a processor.

11. The method of claim 10, wherein the aligning the border along the first metal track of the plurality of metal tracks comprises aligning a first metal region along the first metal track of the plurality of metal tracks, and the first metal region abuts or overlaps the first active sheet.

12. The method of claim 11, wherein the first metal region is a first metal region of a plurality of metal regions, the aligning the first metal region along the first metal track of the plurality of metal tracks comprises aligning the plurality of metal regions along the plurality of metal tracks, and each of the first metal region and second and third metal regions of the plurality of metal regions overlaps the first active sheet.

13. The method of claim 12, wherein each of fourth through sixth metal regions of the plurality of metal regions overlaps the second active sheet.

14. The method of claim 13, wherein seventh and eighth metal regions of the plurality of metal regions are a first subset of two metal regions of the plurality of metal regions that overlap the third active sheet, and ninth and tenth metal regions of the plurality of metal regions are a second subset of two metal regions of the plurality of metal regions that overlap the fourth active sheet.

15. The method of claim 10, wherein a sum of the width values of the first and second active sheets is greater than three times the metal track pitch.

16. A method of generating an integrated circuit (IC) layout diagram, the method comprising:

abutting a first row of cells with a second row of cells along a border, the first row of cells comprising first and second active sheets extending along a row direction, the second row of cells comprising third and fourth active sheets extending along the row direction; and overlapping each of the first through fourth active sheets with a corresponding first through fourth back-side via region, wherein each of the first through fourth active sheets and first through fourth back-side via regions has a width in a width direction perpendicular to the row direction, the width having a width value, a single width value of each of the first and second active sheets is greater than a single width value of the third and fourth active sheets, a single width value of each of the first and second back-side via regions is greater than a single width value of each of the third and fourth back-side via regions, a distance from the first active sheet to the border has a value less than a minimum spacing rule for metal-like defined regions of a manufacturing process corresponding to the IC layout diagram, and at least one of the abutting the first row of cells with the second row of cells or the overlapping the first through fourth active sheets with the first through fourth back-side via regions is performed by a processor.

17. The method of claim 16, wherein the first row of cells further comprises:
  a first metal-like defined region overlapping each of the first active sheet and the first back-side via region; and
  a second metal-like defined region overlapping each of the second active sheet and the second back-side via region, the second row of cells further comprises:
  a third metal-like defined region overlapping each of the third active sheet and the third back-side via region; and
  a fourth metal-like defined region overlapping each of the fourth active sheet and the fourth back-side via region, and the first thorough fourth metal-like defined regions are aligned in the width direction.

18. The method of claim 17, wherein a distance from the first metal-like defined region to the border has a value less than the minimum spacing rule.

19. The method of claim 16, wherein the first and third active sheets correspond to nano-sheets having p-type doping and located in a same n-well.

20. The method of claim 16, wherein the abutting the first row of cells with the second row of cells along the border comprises the first row of cells corresponding to a timing-critical circuit application.

* * * * *